US012777719B2

(12) United States Patent
Wang et al.

(10) Patent No.: US 12,777,719 B2
(45) Date of Patent: Oct. 27, 2026

(54) THIN FILM TRANSISTOR AND ARRAY SUBSTRATE

(71) Applicant: BOE TECHNOLOGY GROUP CO., LTD., Beijing (CN)

(72) Inventors: Lizhong Wang, Beijing (CN); Tianmin Zhou, Beijing (CN); Hehe Hu, Beijing (CN); Shuilang Dong, Beijing (CN); Wenhua Wang, Beijing (CN); Nianqi Yao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 942 days.

(21) Appl. No.: 18/103,355

(22) Filed: Jan. 30, 2023

(65) Prior Publication Data

US 2023/0178562 A1 Jun. 8, 2023

Related U.S. Application Data

(63) Continuation-in-part of application No. 16/876,344, filed on May 18, 2020, now Pat. No. 11,605,739.

(30) Foreign Application Priority Data

Sep. 24, 2019 (CN) ........................ 201910904728.X

(51) Int. Cl.
*H10D 86/60* (2025.01)
*H10D 86/40* (2025.01)

(52) U.S. Cl.
CPC ........... *H10D 86/60* (2025.01); *H10D 86/423* (2025.01)

(58) Field of Classification Search
None
See application file for complete search history.

(56) References Cited

U.S. PATENT DOCUMENTS

2008/0299702 A1 12/2008 Son et al.
2010/0025675 A1 2/2010 Yamazaki et al.
(Continued)

FOREIGN PATENT DOCUMENTS

CN 102859704 A 1/2013
CN 102939659 A 2/2013
(Continued)

OTHER PUBLICATIONS

English translation of CN108461403 (Year: 2018).*
(Continued)

*Primary Examiner* — Bo B Jang
(74) *Attorney, Agent, or Firm* — XSENSUS LLP

(57) ABSTRACT

A thin film transistor includes an active layer, a first loose layer and a first oxygen release layer. The first loose layer is at least disposed on a first surface of the active layer perpendicular to a thickness direction of the active layer, and is in contact with the active layer. A material of the first loose layer includes a first inorganic oxide insulating material. The first oxygen release layer is disposed on a surface of the first loose layer facing away from the active layer, and is in contact with the first loose layer. A material of the first oxygen release layer is a first oxygen-containing insulating material. A porosity of the first loose layer is different from a porosity of the first oxygen release layer, and/or an oxygen content of the first loose layer is different from an oxygen content of the first oxygen release layer.

20 Claims, 21 Drawing Sheets

(56) References Cited

U.S. PATENT DOCUMENTS

| | | | |
|---|---|---|---|
| 2011/0263082 A1 | 10/2011 | Yamazaki | |
| 2011/0303913 A1 | 12/2011 | Yamazaki et al. | |
| 2013/0048977 A1 | 2/2013 | Watanabe et al. | |
| 2014/0339537 A1 | 11/2014 | Bae | |
| 2017/0104102 A1 | 4/2017 | Liu et al. | |

FOREIGN PATENT DOCUMENTS

| | | | |
|---|---|---|---|
| CN | 103000694 | A | 3/2013 |
| CN | 104157693 | A | 11/2014 |
| CN | 104701383 | A | 6/2015 |
| CN | 108461403 | A | 8/2018 |
| CN | 108987485 | A | 12/2018 |

OTHER PUBLICATIONS

First Office Action for Application No. 201910904728.X issued by Chinese Patent Office on Apr. 13, 2022.
Requirement for Restriction-Election for U.S. Appl. No. 16/876,344 issued by the United States Patent Office on Mar. 3, 2022.
Non-Final Office Action for U.S. Appl. No. 16/876,344 issued by the United States Patent Office on Jun. 9, 2022.
Final Office Action for U.S. Appl. No. 16/876,344 issued by the United States Patent Office on Sep. 21, 2022.
Notice of Allowance for U.S. Appl. No. 16/876,344 issued by the United States Patent Office on Dec. 6, 2022.

* cited by examiner

THIN FILM TRANSISTOR AND ARRAY SUBSTRATE

CROSS-REFERENCE TO RELATED APPLICATIONS

This application is a Continuation-in-Part of U.S. patent application Ser. No. 16/876,344, filed on May 18, 2020, which claims priority to and the benefit of Chinese Patent Application No. 201910904728.X, filed on Sep. 24, 2019, which are incorporated herein by reference in their entirety.

TECHNICAL FIELD

The present disclosure relates to the field of display technologies, and in particular, to a thin film transistor and a manufacturing method thereof, and an array substrate.

BACKGROUND

Metal oxide thin film transistors have advantages of high electron mobility, uniform device performance, being suitable for mass production, low manufacturing temperature, being suitable for flexible display, wide forbidden band and transparent display, and are more and more widely applied to display panels.

SUMMARY

In one aspect, a thin film transistor including an active layer, a first loose layer, and a first oxygen release layer is provided. The first loose layer is at least disposed on a first surface of the active layer perpendicular to a thickness direction of the active layer, and is in contact with the active layer. A material of the first loose layer includes a first inorganic oxide insulating material. The first oxygen release layer is disposed on a surface of the first loose layer facing away from the active layer, and is in contact with the first loose layer. A material of the first oxygen release layer is a first oxygen-containing insulating material. A porosity of the first loose layer is different from a porosity of the first oxygen release layer, and/or an oxygen content of the first loose layer is different from an oxygen content of the first oxygen release layer.

In some embodiments, the porosity of the first loose layer is less than the porosity of the first oxygen release layer.

In some embodiments, the porosity of the first loose layer is capable of being represented by: after being immersed in an etching solution, the first loose layer having pores with a size range of 30 nm to 150 nm; and the porosity of the first oxygen release layer is capable of being represented by: after being immersed in the etching solution, the first oxygen release layer having pores with a size range of 50 nm to 200 nm. The etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %.

In some embodiments, a density of the first loose layer is greater than a density of the first oxygen release layer.

In some embodiments, the density of the first loose layer is capable of being represented by: an etching rate of the first loose layer in an etching solution is in a range of 30 Å/s to 100 Å/s; and the density of the first oxygen release layer is capable of being represented by: an etching rate of the first oxygen release layer in the etching solution is in a range of 50 Å/s to 200 Å/s. The etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %.

In some embodiments, a material of the first loose layer includes a silicon (Si) element and an oxygen (O) element, and a refractive index thereof is in a range of approximately 1.445 to approximately 1.455; and a material of the first oxygen release layer includes the silicon (Si) element and the oxygen (O) element, and a refractive index thereof is in a range of approximately 1.440 to approximately 1.470.

In some embodiments, a material of the first loose layer includes a silicon (Si) element and an oxygen (O) element, and the first loose layer has an infrared spectrum in which an infrared wavenumber corresponding to a Si—O bond absorption peak is in a range of approximately 1050 $cm^{-1}$ to approximately 1060 $cm^{-1}$, and a material of the first oxygen release layer includes the silicon (Si) element and the oxygen (O) element, and the first oxygen release layer has an infrared spectrum in which an infrared wavenumber corresponding to a Si—O bond absorption peak is in a range of approximately 1060 $cm^{-1}$ to approximately 1072 $cm^{-1}$.

In some embodiments, the first loose layer is capable of releasing oxygen of approximately 1E18 molec/$cm^3$ to approximately 8E18 molec/$cm^3$ in a temperature range of 25° C. to 350° C., and the first oxygen release layer is capable of releasing oxygen of approximately 1E19 molec/$cm^3$ to approximately 1E21 molec/$cm^3$ in the temperature range of 25° C. to 350° C.

In some embodiments, the thin film transistor further includes a second loose layer that is at least disposed on a second surface of the active layer opposite to the first surface and is in contact with the active layer. A material of the second loose layer includes a second inorganic oxide insulating material, and the first loose layer is in contact with the second loose layer at at least one side face of the active layer.

In some embodiments, the thin film transistor further includes a second oxygen release layer that is disposed on a surface of the second loose layer facing away from the active layer and is in contact with the second loose layer. A material of the second oxygen release layer is a second oxygen-containing insulating material, and the second oxygen release layer is capable of releasing oxygen of approximately 1E19 molec/$cm^3$ to approximately 1E21 molec/$cm^3$ in a temperature range of 25° C. to 350° C.

In some embodiments, the material of the first loose layer is the same as the material of the second loose layer, and the first oxygen-containing insulating material is the same as the second oxygen-containing insulating material.

In some embodiments, the material of the first loose layer, the material of the second loose layer, the material of the first oxygen release layer, and the material of the second oxygen release layer each include an oxygen (O) element, and at least one of a silicon (Si) element or an aluminum (Al) element.

In some embodiments, the material of the first loose layer and the material of the second loose layer are both include the silicon (Si) element and the oxygen (O) element, and a refractive index of the first loose layer and a refractive index of the second loose layer are in a range of approximately 1.445 to approximately 1.455.

In some embodiments, a material of the active layer includes an oxide semiconductor material.

In some embodiments, the thin film transistor further includes a gate, a source, a drain, and at least one of a first silicon nitride layer or a second silicon nitride layer. The gate is disposed at a side of the active layer away from the first loose layer. The source and the drain are disposed on the first surface of the active layer and are in direct contact with the active layer. The first silicon nitride layer is disposed at a side of the active layer proximate to the gate, and the second silicon nitride layer is disposed on a surface of the first oxygen release layer facing away from the gate.

In some embodiments, the thin film transistor further includes a gate, a source, a drain, and at least one of a first silicon nitride layer or a second silicon nitride layer. The gate is disposed at a side of the active layer away from the first loose layer. The source and the drain are disposed at a side of the active layer away from the gate, and the source and the drain are each in contact with the active layer through at least one via hole formed in a first insulating layer including both the first loose layer and the first oxygen release layer. The first silicon nitride layer is disposed at a side of the active layer proximate to the gate, and the second silicon nitride layer is disposed on a surface of the first oxygen release layer facing away from the gate.

In some embodiments, the thin film transistor further includes a gate, a source, a drain, and at least one of a first silicon nitride layer or a second silicon nitride layer. The gate is disposed at a side of the active layer away from the first loose layer, and the gate is disposed at a same side of the active layer as the source and the drain; the thin film transistor further includes a second insulating layer, the second insulating layer includes an interlayer insulating layer between the gate and both the source and the drain, and a gate insulating layer between the gate and the active layer; and the source and the drain are each in contact with the active layer through at least one via hole formed in the second insulating layer. The first silicon nitride layer is disposed on a surface of the first oxygen release layer facing away from the gate, and the second silicon nitride layer is disposed between the active layer and both the source and the drain.

In some embodiments, the thin film transistor further includes a gate, a source, a drain, and at least one of a first silicon nitride layer or a second silicon nitride layer. The gate is disposed at a same side of the active layer as the first loose layer. The source and the drain are disposed on a second surface of the active layer opposite to the first surface, and are in direct contact with the active layer. The first silicon nitride layer is disposed between the gate and the first oxygen release layer, and the second silicon nitride layer is disposed at a side of the active layer away from the gate.

In some embodiments, the thin film transistor further includes a gate, a source, a drain, and at least one of a first silicon nitride layer or a second silicon nitride layer. The gate is disposed at a same side of the active layer as the first loose layer. The source and the drain are disposed at a side of the active layer away from the gate; and the thin film transistor further includes a third insulating layer between the active layer and both the source and the drain, and the source and the drain are each in contact with the active layer through at least one via hole formed in the third insulating layer. The first silicon nitride layer is disposed between the gate and the first oxygen release layer, and the second silicon nitride layer is disposed at a side of the active layer away from the gate.

In some embodiments, the thin film transistor further includes a gate, a source, a drain, and at least one of a first silicon nitride layer or a second silicon nitride layer. The gate is disposed at a same side of the active layer as the first loose layer, and the gate is disposed at a same side of the active layer as the source and the drain; and the thin film transistor further includes an interlayer insulating layer that is disposed between the gate and both the source and the drain, and the source and the drain are each in contact with the active layer through at least one via hole formed in a fourth insulating layer including all of the first loose layer, the first oxygen release layer and the interlayer insulating layer. The first silicon nitride layer is disposed at a side of the active layer away from the gate, and the second silicon nitride layer is disposed on a surface of the first oxygen release layer facing away from the active layer.

In another aspect, an array substrate including a base and a plurality of thin film transistors disposed above the base is provided.

In yet another aspect, a method of manufacturing a thin film transistor is provided. The method includes: forming the active layer; forming the first loose layer; and forming the first oxygen release layer. The material of the first loose layer includes the first inorganic oxide insulating material. The material of the first oxygen release layer is the first oxygen-containing insulating material. The first oxygen release layer is capable of releasing oxygen of approximately 1E19 molec/$cm^3$ to approximately 1E21 molec/$cm^3$ in a temperature range of 25° C. to 350° C.

In some embodiments, the material of the first loose layer is $SiO_2$. Forming the first loose layer includes: forming the first loose layer under a condition that a gas flow ratio of $N_2O$ to $SiH_4$ is in a range of approximately 90:1 to approximately 170:1, an air pressure is in a range of approximately 500 mTorr to approximately 900 mTorr, and a power is in a range of approximately 1000 W to approximately 7000 W.

In some embodiments, the material of the first oxygen release layer is $SiO_2$. Forming the first oxygen release layer includes: forming the first oxygen release layer under a condition that the gas flow ratio of $N_2O$ to $SiH_4$ is in a range of approximately 40:1 to approximately 170:1, the air pressure is in a range of approximately 1000 mTorr to approximately 2100 mTorr, and the power is in a range of approximately 9000 W to approximately 21000 W.

In some embodiments, forming the active layer, the first loose layer, and the first oxygen release layer, includes: forming the first oxygen release layer; forming the first loose layer on the first oxygen release layer; and forming the active layer on the first loose layer. The method further includes: forming a second loose layer on the active layer. The first loose layer is in contact with the second loose layer at at least one side face of the active layer, and a material of the second loose layer is $SiO_2$. Forming the second loose layer includes: forming the second loose layer under a condition that a gas flow ratio of $N_2O$ to $SiH_4$ is in a range of approximately 90:1 to approximately 170:1, a gas flow ratio of $N_2O$ to $NH_3$ is in a range of approximately 10:1 to approximately 100:1, an air pressure is in a range of approximately 500 mTorr to approximately 900 mTorr, and a power is in a range of approximately 1000 W to approximately 7000 W.

In some embodiments, the method of manufacturing the thin film transistor further includes: forming a second oxygen release layer on the second loose layer, a material of the second oxygen release layer being $SiO_2$. Forming the second oxygen release layer includes: forming the second oxygen release layer under a condition that the gas flow ratio of $N_2O$ to $SiH_4$ is in a range of approximately 40:1 to approximately 170:1, the air pressure is in a range of approximately 1000 mTorr to approximately 2100 mTorr, and the power is in a range of approximately 9000 W to approximately 21000 W.

In some embodiments, the method of manufacturing the thin film transistor further includes: forming a second loose layer, a material of the second loose layer being $SiO_2$. Forming the active layer, the first loose layer, and the first oxygen release layer, includes: forming the active layer on the second loose layer; forming the first loose layer on the active layer; and forming the first oxygen release layer on the first loose layer. The first loose layer is in contact with the second loose layer at at least one side face of the active layer. Forming the second loose layer includes: forming the second loose layer under a condition that a gas flow ratio of $N_2O$ to $SiH_4$ is in a range of approximately 90:1 to approximately 170:1, a gas flow ratio of $N_2O$ to $NH_3$ is in a range of approximately 10:1 to approximately 100:1, an air pressure is in a range of approximately 500 mTorr to 900 mTorr, and a power is in a range of approximately 1000 W to approximately 7000 W.

In some embodiments, before forming the second loose layer, the method further includes: forming a second oxygen release layer, a material of the second oxygen release layer being $SiO_2$. Forming the second loose layer includes: forming the second loose layer on the second oxygen release layer. Forming the second oxygen release layer includes: forming the second oxygen release layer under a condition that the gas flow ratio of $N_2O$ to $SiH_4$ is in a range of approximately 40:1 to approximately 170:1, the air pressure is in a range of approximately 1000 mTorr to approximately 2100 mTorr, and the power is in a range of approximately 9000 W to approximately 21000 W.

BRIEF DESCRIPTION OF THE DRAWINGS

In order to describe technical solutions in the embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products and an actual process of a method that the embodiments of the present disclosure relate to.

DETAILED DESCRIPTION

Figure 1:
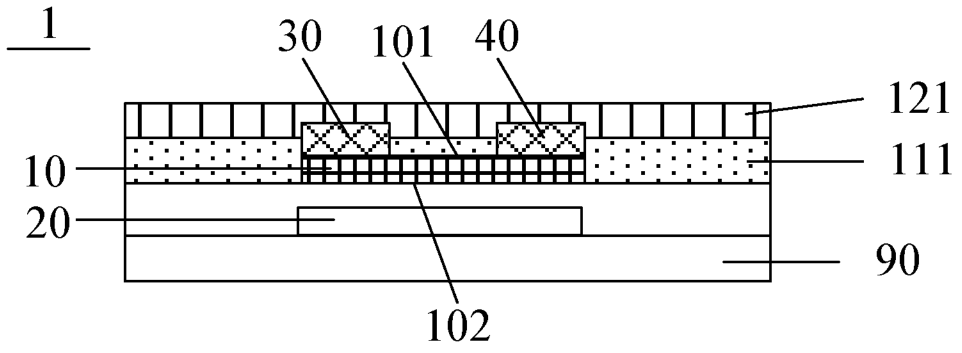
FIG. 1 is a diagram showing a structure of a back-channel-etch oxide thin film transistor, in accordance with some embodiments.

Technical solutions in some embodiments of the present disclosure will be described clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term “comprise/include” and other forms thereof such as the third-person singular form “comprises/includes” and the present participle form “comprising/including” in the description and the claims are construed as open and inclusive, i.e., “inclusive, but not limited to”. In the description, the terms such as “one embodiment”, “some embodiments”, “exemplary embodiments”, “example”, “some examples”, or “specific example” are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

The terms such as “first” and “second” are used for descriptive purposes only, and cannot be construed as indicating or implying the relative importance or implicitly indicating the number of indicated technical features below. Thus, features defined as “first” and “second” may explicitly or implicitly include one or more of the features. In the description of the embodiments of the present disclosure, term “a plurality of” means two or more unless otherwise specified.

In the description of some embodiments, the terms such as “connected” and its extensions may be used. For example, the term “connected” may be used in the description of some embodiments to indicate that two or more components are in direct physical or electrical contact with each other. The embodiments disclosed herein are not necessarily limited to the contents herein.

The expression of A and/or B includes the following combinations: only A, only B, and A and B.

In addition, orientation terms such as “upper”, “lower”, “left”, and “right”, are defined relative to positions of components placed in the drawings. It will be understood that these directional terms are relative concepts and used for relative description and clarification, which may be changed correspondingly according to changes of the positions of the components placed in the drawings.

As people’s requirements for a display effect of a display panel continue to increase, a display panel including a traditional amorphous silicon (a-Si) thin film transistor (TFT) array substrate has been unable to meet performance requirements of narrow bezel, high definition, and high refresh rate. Although a low temperature poly-silicon (LTPS) thin film transistor of the array substrate has high mobility, it cannot be applied to a large-sized display panel due to a need for laser crystallization in a manufacturing process.

Compared with the a-Si TFT, the metal-oxide thin film transistor has advantages of high electron mobility, uniform device performance, being suitable for mass production, low manufacturing temperature, being suitable for flexible display, wide forbidden band and transparent display.

However, as for a display panel with 8K resolution and an operating frequency of 120 Hz, a reliability of an oxide thin film transistor is a very important factor restricting an application of the oxide thin film transistor. A main reason is that an oxide active layer of the oxide thin film transistor is prone to an oxygen vacancy defect in a manufacturing process, which causes a poor stability of a positive bias temperature stress (PBTS) of the oxide thin-film transistor, thereby affecting normal operation of a gate driver on array (GOA) circuit and a pixel driving circuit in the display panel. Especially in the GOA circuit of the display panel, a width-to-length ratio of a channel of the oxide thin film transistor is larger, and a heat phenomenon of the GOA circuit is more serious during operation, so that an instability of the PBTS of the oxide thin film transistor has a greater influence on the GOA circuit, which causes a reduction in a yield of the GOA circuit.

As shown in FIGS. 1, 9, 17, 25, 33 and 41, some embodiments of the present disclosure provide a thin film transistor 1. The thin film transistor 1 includes an active layer 10, a first loose layer 111 and a first oxygen release layer 121. The first loose layer 111 is at least disposed on a first surface 101 of the active layer 10 perpendicular to a thickness direction of the active layer 10, and is in contact with the active layer 10. The first oxygen release layer 121 is disposed on a surface of the first loose layer 111 facing away from the active layer 10, and is in contact with the first loose layer 111.

For example, a material of the active layer 10 may include a metal oxide semiconductor material. In some examples below, the active layer 10 may be referred to as an oxide active layer 10. Accordingly, since the thin film transistor 1 includes the active layer 10, for convenience of description, in some examples below, the thin film transistor 1 may be referred to as an oxide thin film transistor 1. It will be understood that for examples and/or embodiments in which an oxide active layer 10 is provided, in a case where some or all of these examples and/or embodiments do not involve the material of the active layer, the oxide active layer 10 in the some or all of these examples and/or embodiments may be replaced with an active layer of another material.

A material of the first loose layer 111 can include or can be a first inorganic oxide insulating material, and a material of the first oxygen release layer 121 can include or can be a first oxygen-containing insulating material.

For example, as shown in FIGS. 1, 9, 17, 25, 33 and 41, the oxide thin film transistor 1 is disposed on a base 90. The base 90 may be a base substrate without any structure provided thereon. The base 90 is, for example, a glass base or a flexible base (e.g., a polyimide base or a polyethylene glycol terephthalate base). Or, the base 90 may include the base substrate and other structure(s) or layer(s) (e.g., a buffer layer and a light shielding layer) disposed on the base substrate.

There are two possible implementations of the positional relationship between the first loose layer 111 and the oxide active layer 10.

First Possible Implementation

Figure 17:
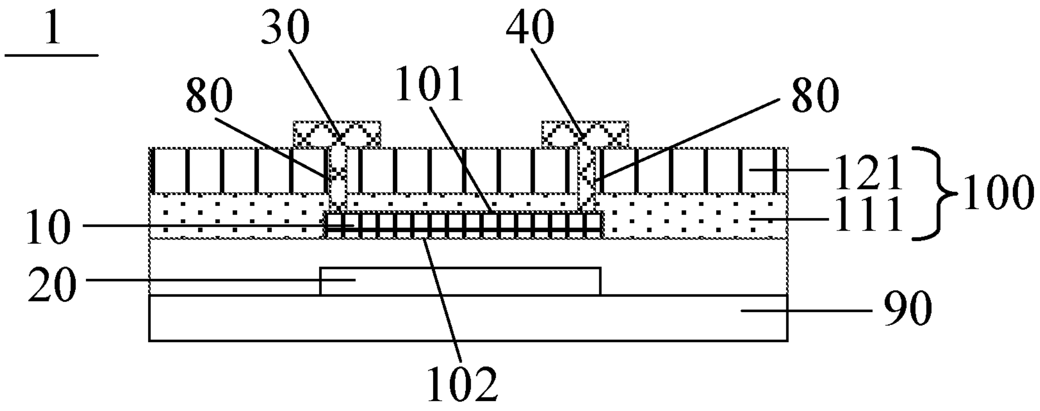
FIG. 17 is a diagram showing a structure of an etch stop oxide thin film transistor, in accordance with some embodiments.
Figure 33:
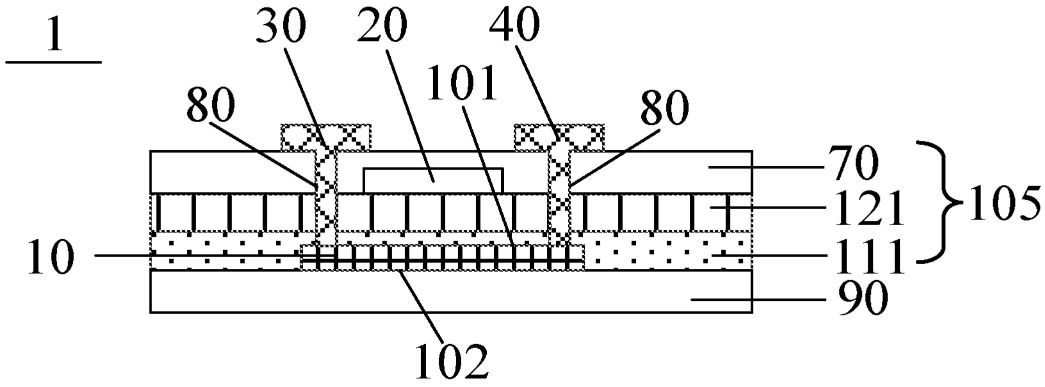
FIG. 33 is a diagram showing a structure of a top-gate oxide thin film transistor, in accordance with some embodiments.

The first surface 101 is a surface of the oxide active layer 10 facing away from the base 90. That is, as shown in FIGS. 1, 17 and 33, the first surface 101 of the oxide active layer 10 is an upper surface of the oxide active layer 10. In this case, the first loose layer 111 may only be in contact with the upper surface of the oxide active layer 10. Or, as shown in FIGS. 1, 17 and 33, the first loose layer 111 may be in contact with the upper surface of the oxide active layer 10 and at least one side face of the oxide active layer 10. For example, as shown in FIGS. 1, 17 and 33, the first loose layer 111 is in contact with the upper surface and all side faces of the oxide active layer 10.

Second Possible Implementation

Figure 9:
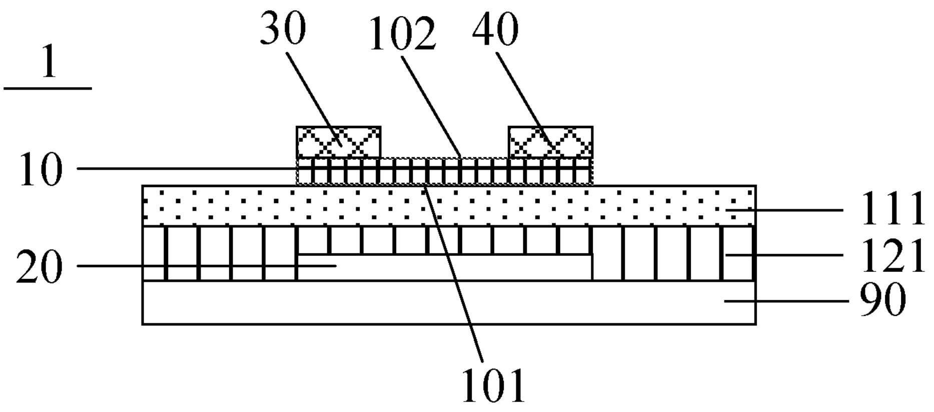
FIG. 9 is a diagram showing a structure of yet another back-channel-etch oxide thin film transistor, in accordance with some embodiments.
Figure 25:
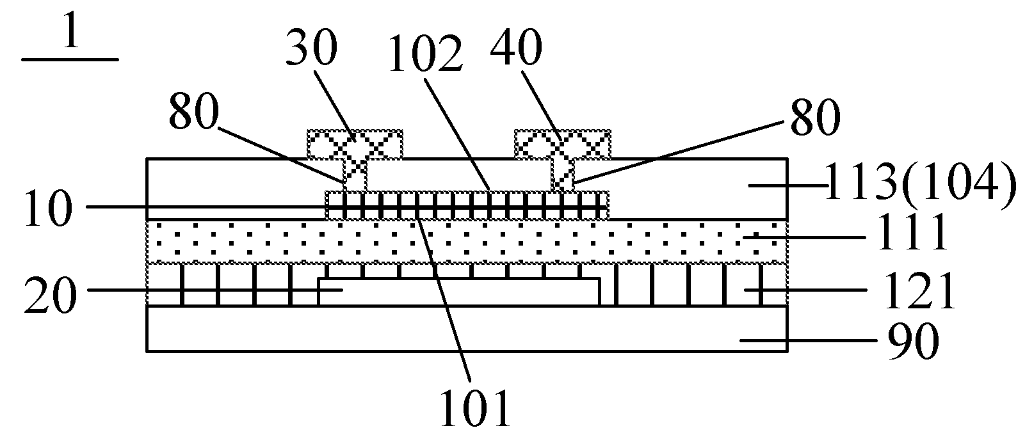
FIG. 25 is a diagram showing a structure of yet another etch stop oxide thin film transistor, in accordance with some embodiments.
Figure 41:
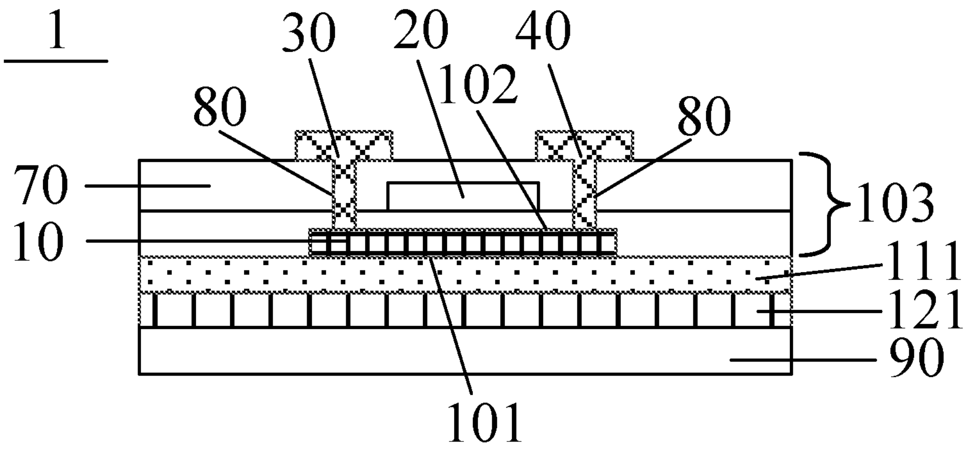
FIG. 41 is a diagram showing a structure of yet another top-gate oxide thin film transistor, in accordance with some embodiments.

The first surface 101 is a surface of the oxide active layer 10 facing the base 90. That is, as shown in FIGS. 9, 25 and 41, the first surface 101 of the oxide active layer 10 is a lower surface of the oxide active layer 10. In this case, as shown in FIGS. 9, 25 and 41, the first loose layer 111 may only be in contact with the lower surface of the oxide active layer 10. Or, the first loose layer 111 may be in contact with both the lower surface of the oxide active layer 10 and at least one side face of the oxide active layer 10. For example, the first loose layer 111 is in contact with the lower surface and all side faces of the oxide active layer 10.

With regard to the contacting manner of the first loose layer 111 and the first oxygen release layer 121, there may be the following three possible implementations.

In a first possible implementation, as shown in FIGS. 1, 9, 17, 25, 33 and 41, an orthographic projection of the first loose layer 111 on the base 90 completely overlaps an orthographic projection of the first oxygen release layer 121 on the base 90. In this case, a surface of the first loose layer 111 facing away from the oxide active layer 10 is in contact with a surface of the first oxygen release layer 121 facing the oxide active layer 10.

In a second possible implementation, an area of the orthographic projection of the first loose layer 111 on the base 90 is less than an area of the orthographic projection of the first oxygen release layer 121 on the base 90. For example, the first oxygen release layer 121 and the first loose layer 111 are disposed between the oxide active layer 10 and the base 90, and the first oxygen release layer 121 is in contact with the surface of the first loose layer 111 facing away from the oxide active layer 10. For another example, the first oxygen release layer 121 and the first loose layer 111 are disposed at a side of the oxide active layer 10 facing away from base 90, and the first oxygen release layer 121 is in contact with the surface of the first loose layer 111 facing away from the oxide active layer 10 and at least one side face (e.g., all side faces) of the first loose layer 111.

In a third possible implementation, the area of the orthographic projection of the first oxygen release layer 121 on the base 90 is less than the area of the orthographic projection of the first loose layer 111 on the base 90. For example, the first oxygen release layer 121 and the first loose layer 111 are disposed at a side of the oxide active layer 10 facing away from base 90, and the first loose layer 111 is in contact with the surface of the first oxygen release layer 121 facing the oxide active layer 10. For another example, the first oxygen release layer 121 and the first loose layer 111 are disposed between the oxide active layer 10 and the base 90, and the first loose layer 111 is in contact with the surface of the first oxygen release layer 121 facing the oxide active layer 10 and at least one side face (e.g., all side faces) of the first oxygen release layer 121.

The first loose layer 111 has, for example, pore structures.

The first oxygen release layer 121 usually contains a large amount of free oxygen, and thus the first oxygen release layer 121 has more defect states therein. If the first oxygen release layer 121 is in contact with the oxide active layer 10, the oxide active layer 10 may be made conductive, thereby causing a failure of the oxide thin film transistor 1. However, in the embodiments of the present disclosure, the first loose layer 111 is provided between the first oxygen release layer 121 and the oxide active layer 10, and the first loose layer 111 has the pore structures, so that oxygen released by the first oxygen release layer 121 may transfer to the oxide active layer 10 through the first loose layer 111.

A porosity of the first loose layer 111 is different from a porosity of the first oxygen release layer 121. Alternatively, an oxygen content of the first loose layer 111 is different from an oxygen content of the first oxygen release layer 121. Alternatively, a porosity of the first loose layer 111 is different from a porosity of the first oxygen release layer 121, and an oxygen content of the first loose layer 111 is different from an oxygen content of the first oxygen release layer 121.

In some embodiments, the porosity of the first loose layer 111 is less than the porosity of the first oxygen release layer 121.

Since pores in each of the first loose layer 111 and the first oxygen release layer 121 are very small, it may be difficult to directly measure the pores thereof, and the porosity of each of the first loose layer 111 and the first oxygen release layer 121 may be measured and represented in the following manner.

After being immersed in an etching solution, the first loose layer 111 has pores with a size range of 30 nm to 150 nm, and the first oxygen release layer has pores with a size range of 50 nm to 200 nm.

The etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %. The term "size" refers to the largest dimension of a cross-section of a pore in a direction perpendicular to an extension thereof, i.e., the largest distance between any two points on the cross-section. For example, in a case where the pore is a circular hole (or an approximately circular hole), the term "size" refers to the diameter of the circular cross section (or an approximately circular cross section) of the circular hole (or the approximately circular hole).

In some embodiments, a density of the first loose layer 111 is greater than a density of the first oxygen release layer 121.

Since it may be difficult to directly measure the densities of the first loose layer 111 and the first oxygen release layer 121, the density of each of the first loose layer 111 and the first oxygen release layer 121 may be measured and represented in the following manner.

An etching rate of the first loose layer 111 in an etching solution is in a range of 30 angstrom per second (Å/s) to 100 Å/s, and an etching rate of the first oxygen release layer 121 in the etching solution is in a range of 50 Å/s to 200 Å/s.

The etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %. The term "etching rate" refers to a thickness of a portion, capable of being etched by the etching solution per second, of a film layer. The smaller the etching rate, the thinner the portion, capable of being etched by the etching solution per second, of the film layer, that is, the less easily the film layer is etched, and the denser the film layer.

In some examples, a thickness of the first loose layer 111 is approximately in a range of 1 nm to 50 nm. For example, the thickness of the first loose layer 111 is 1 nm, 5 nm, 10 nm, 20 nm, 30 nm, 40 nm, or 50 nm. A thickness of the first oxygen release layer 121 is approximately in a range of 100 nm to 400 nm. For example, the thickness of the first oxygen release layer 121 is 100 nm, 150 nm, 200 nm, 250 nm, 300 nm, 350 nm, or 400 nm.

A material of the active layer 10 may be any one of an oxide semiconductor material, a silicon material, a nano-carbon material, and an organic semiconductor.

For example, the material of the active layer 10 may be the silicon material, i.e., including a silicon (Si) element, such as at least one of amorphous silicon, single-crystal silicon or polycrystalline silicon (e.g., low temperature polycrystalline silicon (LTPS)).

In some embodiments, the material of the active layer 10 may be the oxide semiconductor material, that is, the material of the oxide active layer 10 can include or can be a metal oxide with a high carrier mobility, for example, indium gallium zinc oxide (IGZO). The IGZO may include at least one of amorphous IGZO, polycrystalline IGZO, or single-crystal IGZO. The material of the oxide active layer 10 is not limited thereto, and can be selected according to actual needs.

In some embodiments, the oxide active layer 10 is formed through a sputtering process. For example, the material of the oxide active layer 10 is IGZO, and the oxide active layer 10 is formed through the sputtering process by using a target material in which a ratio among indium oxide ($In_2O_3$), gallium oxide ($Ga_2O_3$), and zinc oxide (ZnO) is 1:1:1. Of course, the ratio among $In_2O_3$, $Ga_2O_3$ and ZnO may also be other values.

The metal oxide may be other materials with a high mobility or high light stability, such as any one or more of indium gallium oxide (IGO), indium gallium zinc tin oxide (IGZTO), indium zinc tin oxide (IZTO), or lanthanide metal oxide (Ln-oxide semiconductor).

For example, the material of the active layer 10 may be a nano-carbon material such as carbon nanotubes, carbon nanofibers, nano-carbon spheres.

For example, the material of the active layer 10 may be an organic semiconductor, such as pentacene or the like.

In the oxide thin film transistor 1, the oxide active layer 10, the first loose layer 111 and the first oxygen release layer 121 are stacked in the thickness direction of the oxide active layer 10, and two opposite surfaces of the first loose layer 111 are in contact with the oxide active layer 10 and the first oxygen release layer 121 respectively, so that the oxygen released by the first oxygen release layer 121 is transferred to the oxide active layer 10 through the first loose layer 111 to fill the oxygen vacancies in the oxide active layer 10. Therefore, the oxygen vacancies in the oxide active layer 10 may be reduced, the stability of the PBTS of the oxide thin film transistor 1 may be improved, and the reliability of the oxide thin film transistor 1 may be further improved.

In some embodiments, the first loose layer is capable of releasing oxygen of approximately 1E18 molecules per cubic centimeter (molec/$cm^3$) to approximately 8E18 molec/$cm^3$ in a temperature range of 25° C. to 350° C., and the first oxygen release layer is capable of releasing oxygen of approximately 1E19 molec/$cm^3$ to approximately 1E21 molec/$cm^3$ in the temperature range of 25° C. to 350° C.

Here, the amount of released oxygen may be measured by a thermal desorption spectroscopy (TDS) apparatus.

In some embodiments, as shown in FIGS. 2, 10, 18, 26, 34 and 42, the oxide thin film transistor 1 further includes a second loose layer 112. The second loose layer 112 is at least disposed on a second surface 102 of the oxide active layer 10 opposite to the first surface 101, and the second loose layer 112 is in contact with the oxide active layer 10. A material of the second loose layer 112 can include or can be a second inorganic oxide insulating material.

Figure 2:
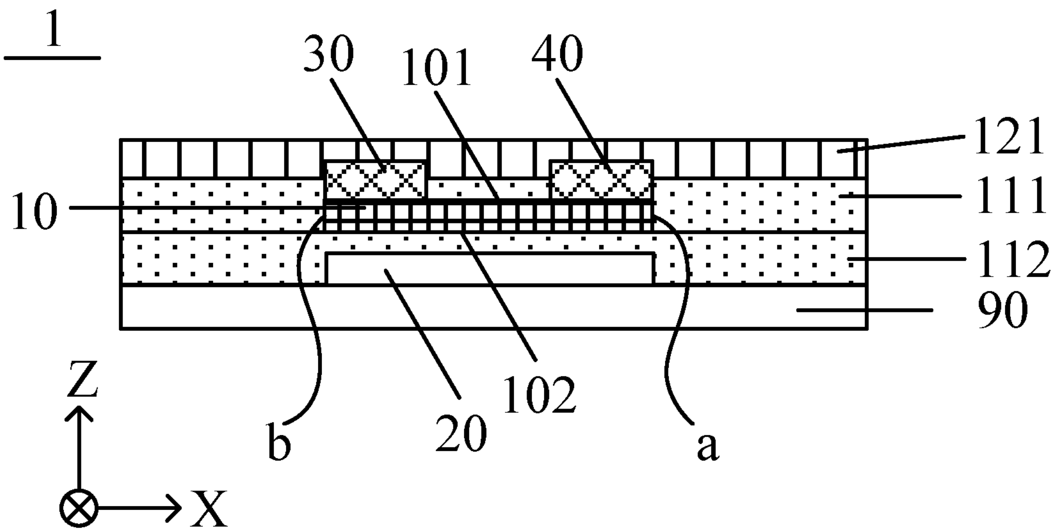
FIG. 2 is a diagram showing a structure of another back-channel-etch oxide thin film transistor, in accordance with some embodiments.

The first loose layer 111 is in contact with the second loose layer 112 at at least one side face of the oxide active layer 10. That is, at at least one side face of the oxide active layer 10, the first loose layer 111 and the second loose layer 112 both extend beyond the side face of the oxide active layer 10 connected to both the first surface and the second surface. For example, the first loose layer 111 is in contact with the second loose layer 112 at each side face of the oxide active layer 10. For example, as shown in FIG. 2, the thickness direction of the oxide active layer 10 is a Z direction, and the first surface 101 and the second surface 102 of the oxide active layer 10 are located on a plane defined by an X direction and a Y direction (denoted by the symbol "⊗" in FIG. 2). The first loose layer 111 and the second loose layer 112 are in contact at opposite sides a and b of the oxide active layer 10 in the X direction. In some examples, the first loose layer 111 and the second loose layer 112 are also in contact at opposite sides (not shown in FIG. 2) of the oxide active layer 10 in the Y direction, i.e., the first loose layer 111 and the second loose layer 112 are in contact at each side of the oxide active layer 10.

The second loose layer 112 also has, for example, pore structures.

For example, at least one of porosity, density, or amount of released oxygen of the second loose layer 112 may be the same as a corresponding property of the first loose layer 111. For the specific description of the porosity, the density and the amount of released oxygen, reference may be made to the foregoing description, and details are not repeated herein.

Optionally, a thickness of the second loose layer 112 is approximately in a range of 1 nm to 50 nm. For example, the thickness of the second loose layer 112 is 1 nm, 5 nm, 10 nm, 20 nm, 30 nm, 40 nm, or 50 nm.

In the oxide thin film transistor 1, the second loose layer 112 and the first loose layer 111 are disposed on the second surface 102 and the first surface 01 of the oxide active layer 10 opposite to each other, respectively, and the first loose layer 111 is in contact with the second loose layer 112 at at least one side face of the oxide active layer 10, so that the oxygen released by the first oxygen release layer 121 may transfer to the oxide active layer 10 through the first loose layer 111 and the second loose layer 112, which may increase paths along which the oxygen released by the first oxygen release layer 121 is transferred to the oxide active layer 10. Therefore, the oxygen vacancies in the oxide active layer 10 may be further reduced, the stability of the PBTS of the oxide thin film transistor 1 may be further improved, and the reliability of the oxide thin film transistor 1 may be further improved.

In some embodiments, as shown in FIGS. 3, 11, 19, 27, 35 and 43, the oxide thin film transistor 1 further includes a second oxygen release layer 122 disposed on a surface of the second loose layer 112 facing away from the oxide active layer 10. The second oxygen release layer 122 is in contact with the second loose layer 112.

For example, at least one of porosity, density, or amount of released oxygen of the second oxygen release layer 122 may be the same as a corresponding property of the first oxygen release layer 121. For the specific description of the porosity, the density and the amount of released oxygen, reference may be made to the foregoing description, and details are not repeated herein.

The second loose layer 112 may be in contact with the second oxygen release layer 122 in the following three possible implementations.

In a first possible implementation, as shown in FIGS. 3, 11, 19, 27, 35 and 43, an orthographic projection of the second loose layer 112 on the base 90 completely overlaps an orthographic projection of the second oxygen release layer 122 on the base 90. In this case, the surface of the second loose layer 112 facing away from the oxide active layer 10 is in contact with a surface of the second oxygen release layer 122 facing the oxide active layer 10.

In a second possible implementation, an area of the orthographic projection of the second loose layer 112 on the base 90 is less than an area of the orthographic projection of the second oxygen release layer 122 on the base 90. For example, the second oxygen release layer 122 and the second loose layer 112 are disposed between the oxide active layer 10 and the base 90, and the second oxygen release layer 122 is in contact with the surface of the second loose layer 112 facing away from the oxide active layer 10. For another example, the second oxygen release layer 122 and the second loose layer 112 are disposed at a side of the oxide active layer 10 facing away from the base 90, and the second oxygen release layer 122 is in contact with the surface of the second loose layer 112 facing away from the oxide active layer 10 and at least one side face (e.g., all side faces) of the second loose layer 112.

In a third possible implementation, the area of the orthographic projection of the second oxygen release layer 122 on the base 90 is less than the area of the orthographic projection of the second loose layer 112 on the base 90. For example, the second oxygen release layer 122 and the second loose layer 112 are disposed at a side of the oxide active layer 10 facing away from the base 90, and the second loose layer 112 is in contact with the surface of the second oxygen release layer 122 facing the oxide active layer 10. For another example, the second oxygen release layer 122 and the second loose layer 112 are disposed between the oxide active layer 10 and the base 90, and the second loose layer 112 is in contact with the surface of the second oxygen release layer 122 facing the oxide active layer 10 and at least one side face (e.g., all side faces) of the second oxygen release layer 122.

A material of the second oxygen release layer 122 can include or can be a second oxygen-containing insulating material, and the second oxygen release layer 122 is capable of releasing oxygen of approximately 1E19 molec/$cm^3$ to approximately 1E21 molec/$cm^3$ in a temperature range of 25° C. to 350° C.

Optionally, a thickness of the second oxygen release layer 122 is approximately in a range of 100 nm to 400 nm. For example, the thickness of the second oxygen release layer 122 is 100 nm, 150 nm, 200 nm, 250 nm, 300 nm, 350 nm, or 400 nm.

In the oxide thin film transistor 1, the second oxygen release layer 122 is disposed on the surface of the second loose layer 112 facing away from the oxide active layer 10, and the second oxygen release layer 122 is in contact with the second loose layer 112. Therefore, both the first oxygen release layer 121 and the second oxygen release layer 122 may release oxygen, and the oxygen released by the first oxygen release layer 121 and the oxygen released by the second oxygen release layer 122 respectively transfer to the oxide active layer 10 through the first loose layer 111 and the second loose layer 112, which may further increase free oxygen and transfer paths of the oxygen.

Optionally, each of the material of the first loose layer 111, the material of the second loose layer 112, the material of the first oxygen release layer 121, and the material of the second oxygen release layer 122 includes an oxygen (O) element, and at least one of a silicon (Si) element or an aluminum (Al) element. That is, the material may include Si and O, or may include Al and O, or may include Si, Al and O. For example, the material includes at least one of silicon dioxide or aluminum oxide ($Al_2O_3$).

For example, the silicon oxide may be $SiO_2$. Of course, the ratio of Si to O in the silicon oxide includes, but is not limited to, 1:2, 1:1, etc.

Raw materials of $SiO_2$ and $Al_2O_3$ are easy to obtain, which may simplify a manufacturing process and reduce a cost.

Optionally, the material of the first loose layer 111 is the same as the material of the second loose layer 112. Optionally, the first oxygen-containing insulating material is the same as the second oxygen-containing insulating material.

For example, the material of the first loose layer 111, the material of the second loose layer 112, the material of the first oxygen release layer 121, and the material of the second oxygen release layer 122 all include Si and O (e.g., $SiO_2$).

In some embodiments, the material of the first loose layer 111 and the material of the second loose layer 112 are both $SiO_2$, and a refractive index of the first loose layer 111 and a refractive index of the second loose layer 112 are approximately in a range of 1.445 to 1.455.

In some embodiments, the material of the first oxygen release layer 121 and the material of the second oxygen release layer 122 are both $SiO_2$, and a refractive index of the first oxygen release layer 121 and a refractive index of the second oxygen release layer 122 are approximately in a range of 1.440 to 1.470.

In some embodiments, as shown in FIGS. 1 to 48, the oxide thin film transistor 1 further includes a gate 20, a source 30, and a drain 40. On this basis, two possible implementations are provided to describe the structure of the oxide thin film transistor 1, but it will be noted that these implementations are merely examples, and the oxide thin film transistor 1 may have other structures.

In a first possible implementation, as shown in FIGS. 1 to 8, 17 to 24 and 41 to 48, the gate 20 is disposed at a side of the oxide active layer 10 away from the first loose layer 111.

The oxide thin-film transistor 1 may be divided into two types, i.e., a bottom-gate thin film transistor and a top-gate thin film transistor.

The bottom-gate thin film transistor may have the following two structures.

In a first structure, as shown in FIGS. 1 to 8, the source 30 and the drain 40 are disposed on the first surface 101 of the oxide active layer 10 facing away from the gate 20, and the source 30 and the drain 40 are in direct contact with the oxide active layer 10. In this case, the oxide thin film transistor 1 is a back-channel-etch (BCE) oxide thin film transistor.

In a second structure, as shown in FIGS. 17 to 24, the source 30 and the drain 40 are disposed at a side of the oxide active layer 10 away from the gate 20 (that is, the first loose layer 111 and the first oxygen release layer 121 are disposed at a same side of the oxide active layer 10 as the source 20 and the drain 40), and the source 30 and the drain 40 are each in contact with the oxide active layer 10 through the at least one via hole 80 formed in a first insulating layer 100. In this case, the oxide thin film transistor 1 is an etch stop (ES) oxide thin film transistor. For example, the first insulating layer 100 includes the first loose layer 111 and the first oxygen release layer 121, and the source 30 and the drain 40 are each in contact with the oxide active layer 10 through at least one via hole 80 extending through the first loose layer 111 and the first oxygen release layer 121.

Figure 42:
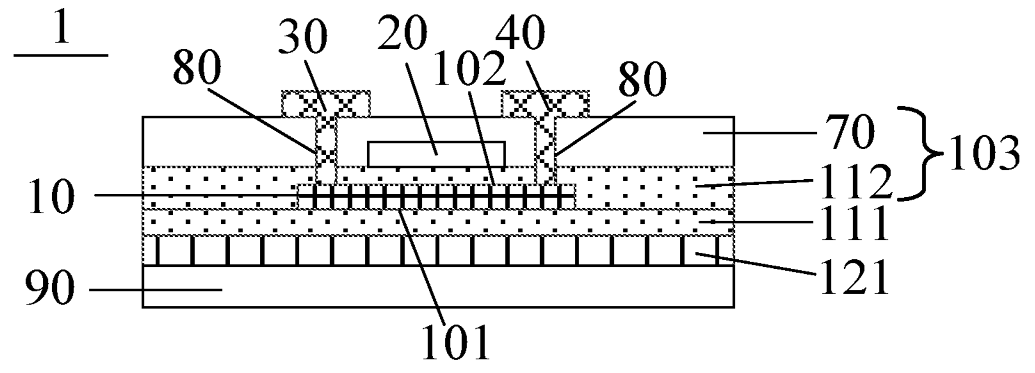
FIG. 42 is a diagram showing a structure of yet another top-gate oxide thin film transistor, in accordance with some embodiments.
Figure 43:
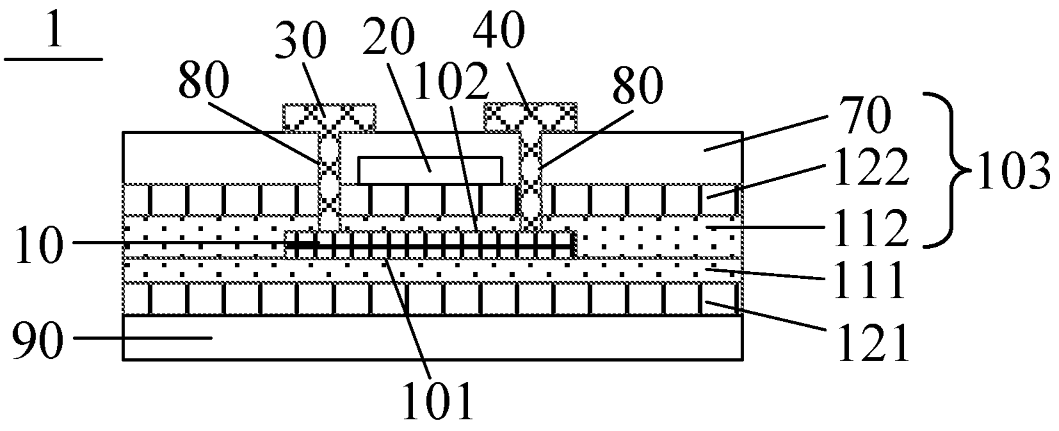
FIG. 43 is a diagram showing a structure of yet another top-gate oxide thin film transistor, in accordance with some embodiments.
Figure 44:
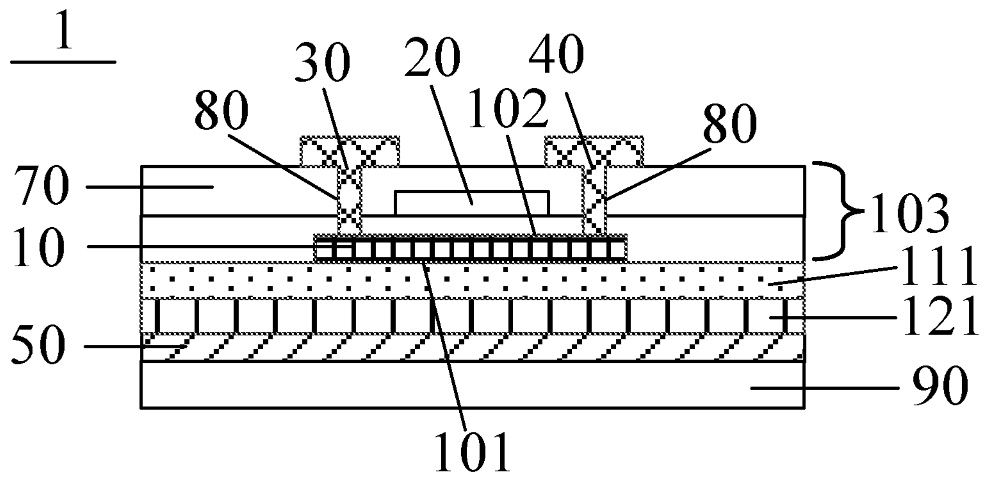
FIG. 44 is a diagram showing a structure of yet another top-gate oxide thin film transistor, in accordance with some embodiments.
Figure 45:
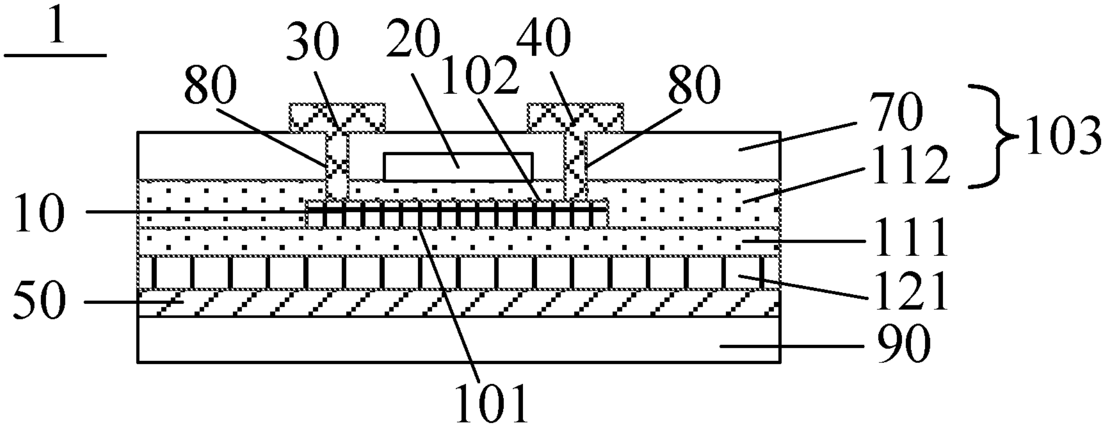
FIG. 45 is a diagram showing a structure of yet another top-gate oxide thin film transistor, in accordance with some embodiments.
Figure 46:
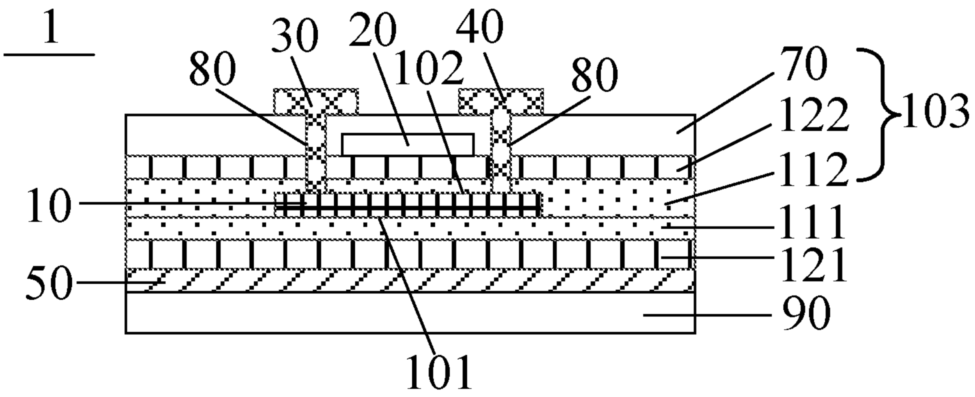
FIG. 46 is a diagram showing a structure of yet another top-gate oxide thin film transistor, in accordance with some embodiments.

As for the top-gate oxide thin film transistor, as shown in FIGS. 41 to 48, the gate 20 is disposed at a same side of the oxide active layer 10 as the source 30 and the drain 40. The oxide thin film transistor further includes a second insulating layer 103 disposed between the oxide active layer 10 and both the source 30 and the drain 40, and the source 30 and the drain 40 are each in contact with the oxide active layer 10 through at least one via hole 80 formed in the second insulating layer 103. As shown in FIGS. 41 to 48, the second insulating layer 103 includes an interlayer insulating layer 70 disposed between the gate 20 and both the source 30 and the drain 40, and a gate insulating layer between the gate 20 and the oxide active layer 10. That is, the source 30 and the drain 40 are each in contact with the oxide active layer 10 through at least one via hole 80 extending through the interlayer insulating layer 70 and the gate insulating layer. As shown in FIGS. 42 and 45, for example, the oxide thin film transistor 1 includes the second loose layer 112, and the second loose layer 112 serves as the gate insulating layer. Or, as shown in FIGS. 43 and 46, for example, the oxide thin film transistor 1 includes the second loose layer 112 and the second oxygen release layer 122, and the second loose layer 112 and the second oxygen release layer 122 together serve as the gate insulating layer.

On a basis of the first possible implementation of the structure of the oxide thin film transistor 1, in some embodiments, as shown in FIGS. 4, 5, 20 and 21, in a case where the oxide thin film transistor 1 is the bottom-gate thin film transistor, the oxide thin film transistor 1 further includes a first silicon nitride layer 50 disposed at a side of the oxide active layer 10 proximate to the gate 20.

Figure 4:
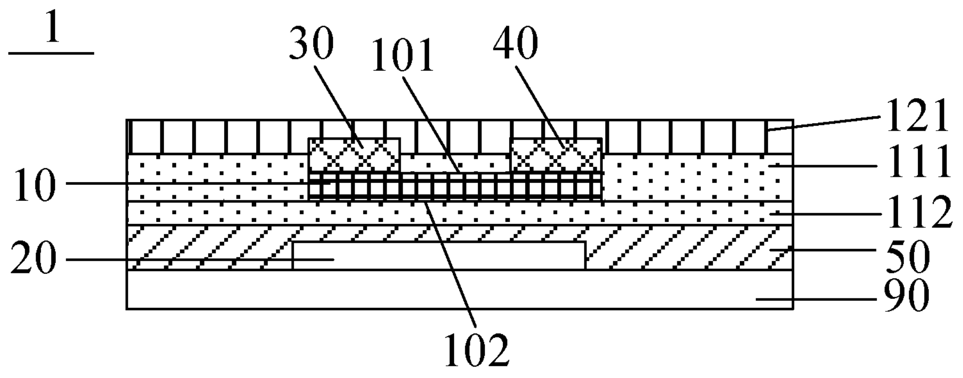
FIG. 4 is a diagram showing a structure of yet another back-channel-etch oxide thin film transistor, in accordance with some embodiments.
Figure 20:
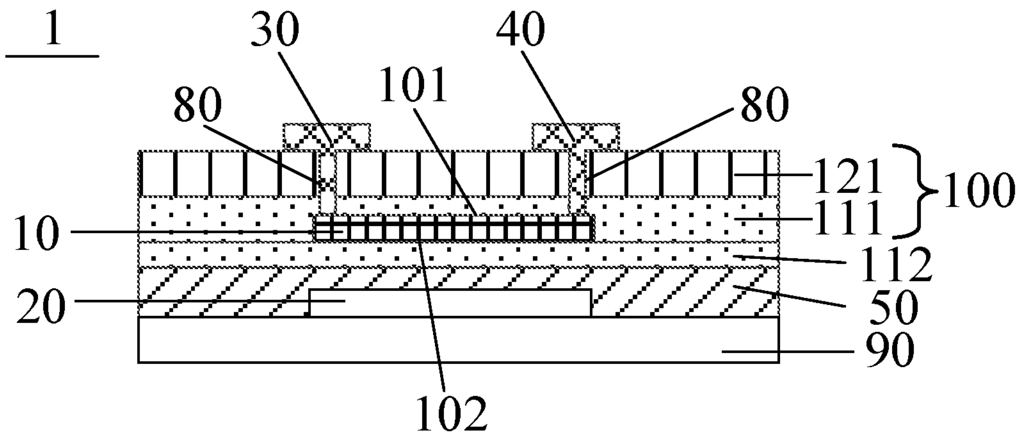
FIG. 20 is a diagram showing a structure of yet another etch stop oxide thin film transistor, in accordance with some embodiments.

In a case where the oxide thin film transistor 1 includes the second loose layer 112, as shown in FIGS. 4 and 20, the first silicon nitride layer 50 is, for example, disposed on a surface of the second loose layer 112 facing the gate 20. In this case, as shown in FIGS. 4 and 20, the first silicon nitride layer 50 and the second loose layer 112 together serve as a gate insulating layer for insulating the gate 20 and the oxide active layer 10.

Figure 5:
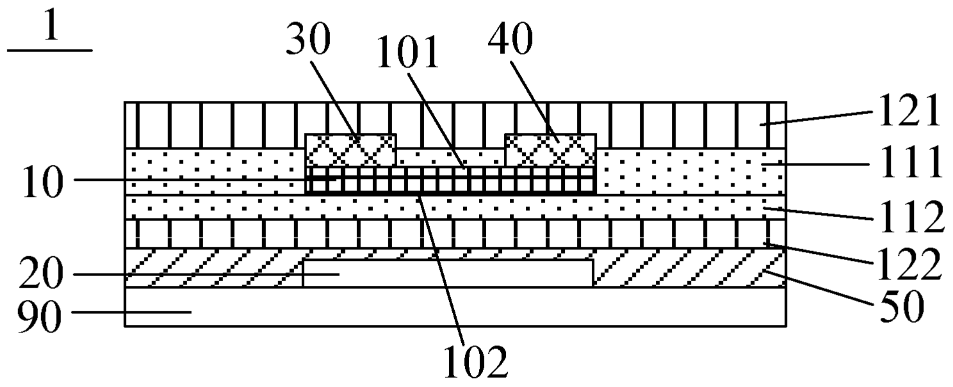
FIG. 5 is a diagram showing a structure of yet another back-channel-etch oxide thin film transistor, in accordance with some embodiments.
Figure 6:
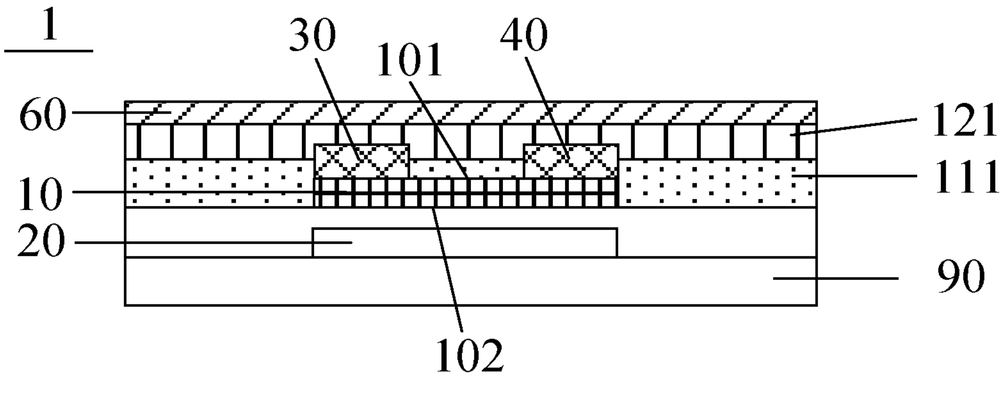
FIG. 6 is a diagram showing a structure of yet another back-channel-etch oxide thin film transistor, in accordance with some embodiments.
Figure 7:
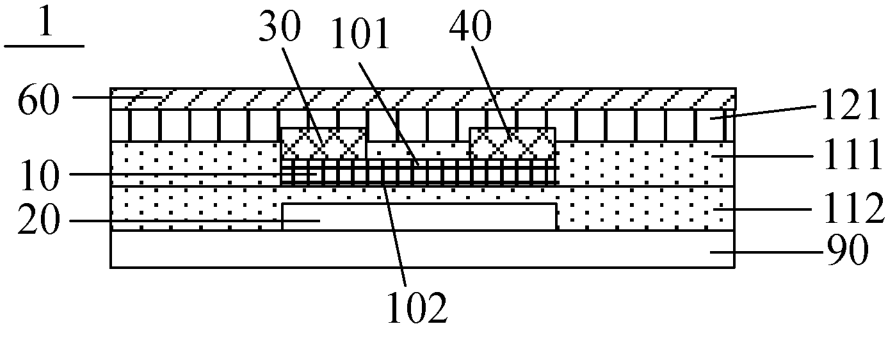
FIG. 7 is a diagram showing a structure of yet another back-channel-etch oxide thin film transistor, in accordance with some embodiments.
Figure 8:
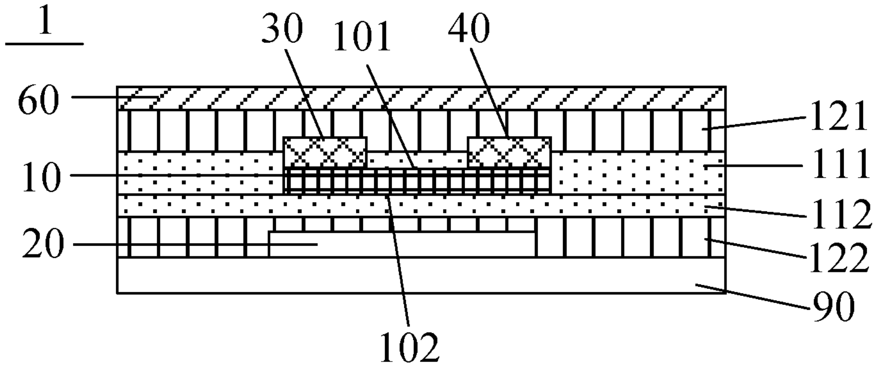
FIG. 8 is a diagram showing a structure of yet another back-channel-etch oxide thin film transistor, in accordance with some embodiments.
Figure 21:
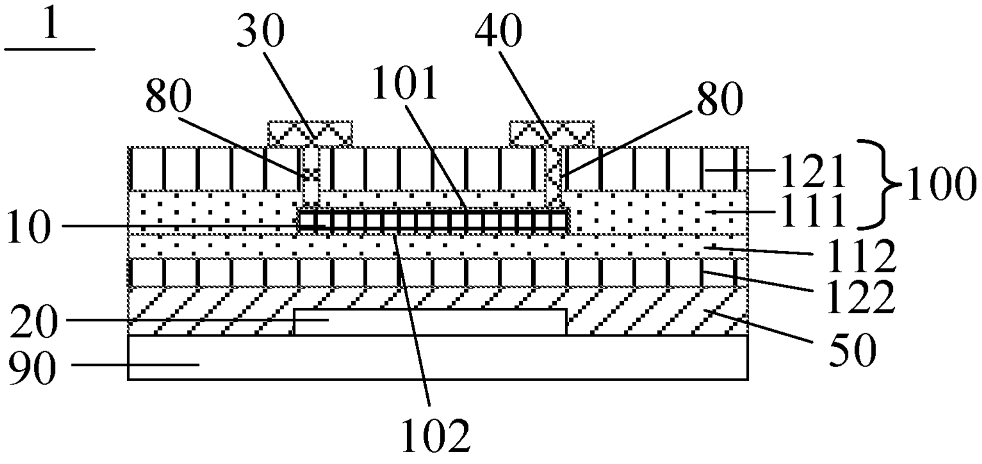
FIG. 21 is a diagram showing a structure of yet another etch stop oxide thin film transistor, in accordance with some embodiments.
Figure 22:
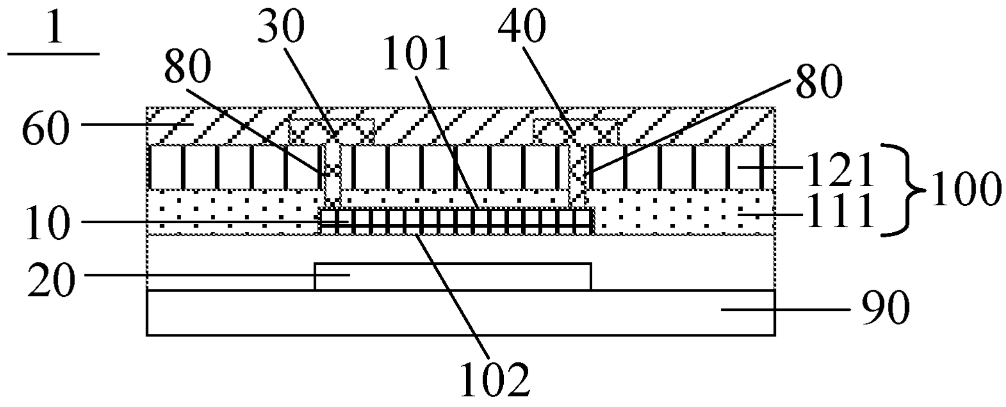
FIG. 22 is a diagram showing a structure of yet another etch stop oxide thin film transistor, in accordance with some embodiments.
Figure 23:
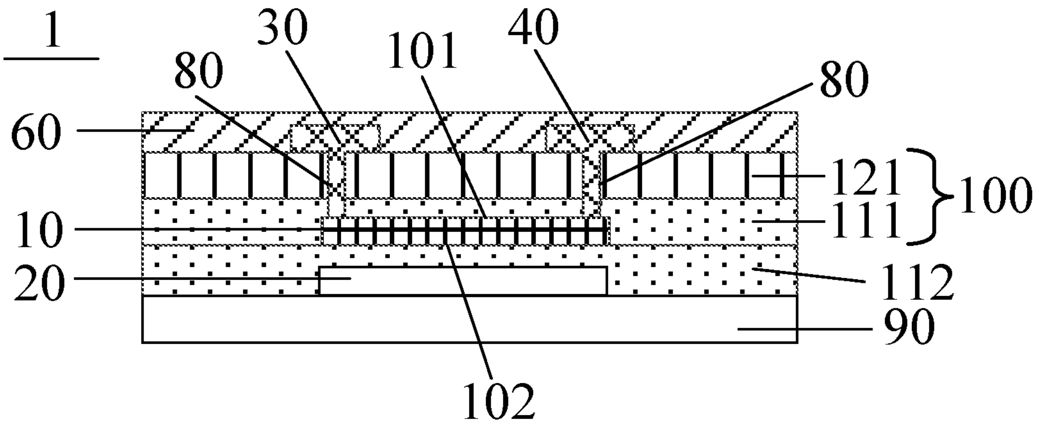
FIG. 23 is a diagram showing a structure of yet another etch stop oxide thin film transistor, in accordance with some embodiments.
Figure 24:
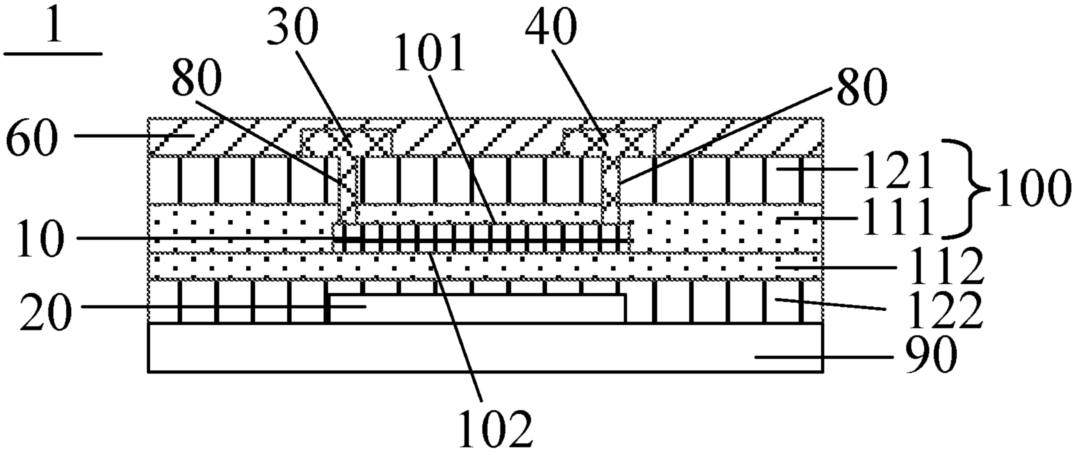
FIG. 24 is a diagram showing a structure of yet another etch stop oxide thin film transistor, in accordance with some embodiments.

In a case where the oxide thin film transistor 1 includes the second loose layer 112 and the second oxygen release layer 122 disposed on a side of the second loose layer 112 facing away from the oxide active layer 10, as shown in FIGS. 5 and 21, the first silicon nitride layer 50 is, for example, disposed on a surface of the second oxygen release layer 122 facing the gate 20. In this case, as shown in FIGS. 5 and 21, the first silicon nitride layer 50, the second loose layer 112, and the second oxygen release layer 122 together serve as the gate insulating layer for insulating the gate 20 and the oxide active layer 10.

In some other embodiments, as shown in FIGS. 44 to 46, in a case where the oxide thin film transistor 1 is the top-gate thin film transistor, the oxide thin film transistor 1 further includes a first silicon nitride layer 50 disposed on a surface of the first oxygen release layer 121 facing away from the gate 20.

Optionally, a thickness of the first silicon nitride layer 50 described in all embodiments is approximately in a range of 100 nm to 400 nm. For example, the thickness of the first silicon nitride layer 50 is 100 nm, 150 nm, 200 nm, 250 nm, 300 nm, 350 nm, or 400 nm.

The first silicon nitride layer 50 is used to prevent water and oxygen or impurities from a side of the base 90 from affecting the oxide active layer 10.

In a case where the oxide thin film transistor 1 is applied to, for example, an array substrate, regardless of whether the oxide thin film transistor 1 is the top-gate thin film transistor or the bottom-gate thin film transistor, the oxide thin film transistor 1 is disposed on the base 90. For example, the base 90 is the glass base, and the first silicon nitride layer 50 is mainly used to prevent sodium ions in the glass base from permeating into the oxide active layer 10. For another example, the base 90 is the flexible base, and the first silicon nitride layer 50 is mainly used to prevent external water and oxygen, or impurities from permeating into the oxide active layer 10 through the base 90.

In some embodiments, as shown in FIGS. 6 to 8 and 22 to 24, the oxide thin film transistor 1 is the bottom-gate thin film transistor, and the oxide thin film transistor 1 further includes a second silicon nitride layer 60 disposed on a surface of the first oxygen release layer 121 facing away from the gate 20.

Figure 47:
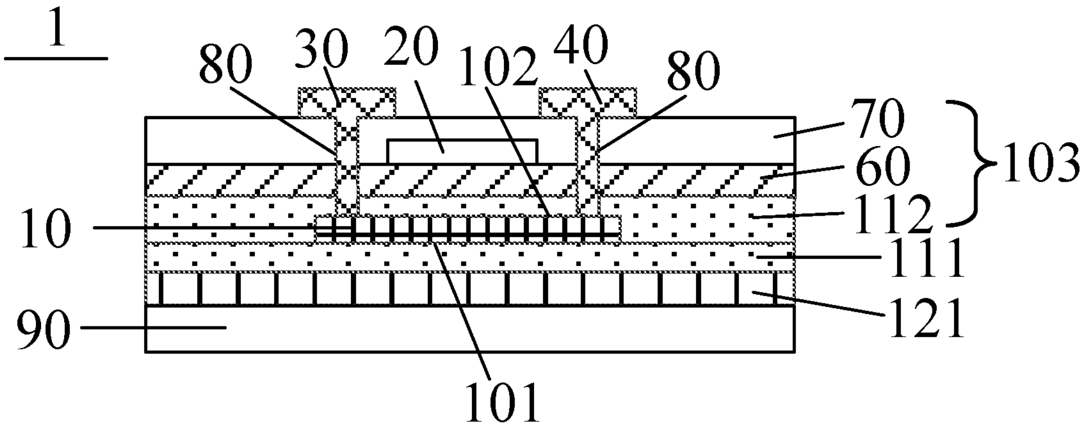
FIG. 47 is a diagram showing a structure of yet another top-gate oxide thin film transistor, in accordance with some embodiments.
Figure 48:
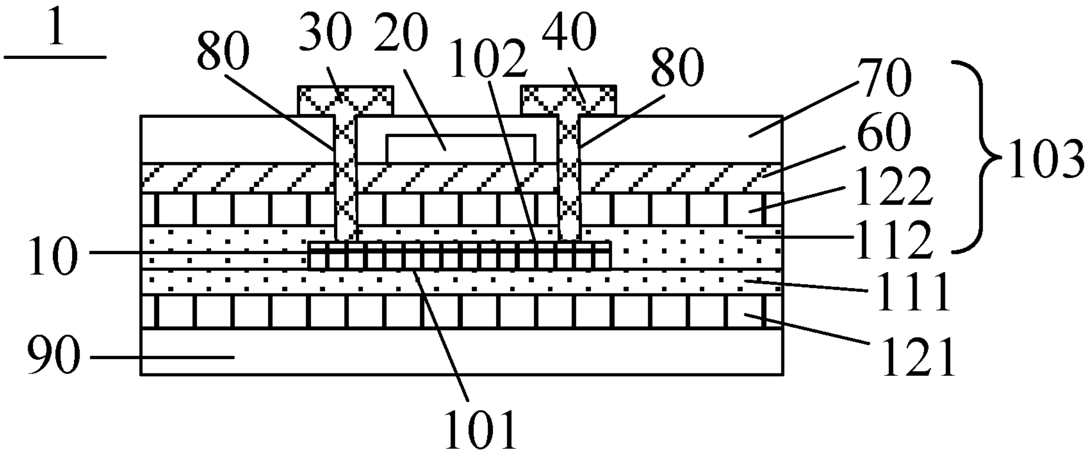
FIG. 48 is a diagram showing a structure of yet another top-gate oxide thin film transistor, in accordance with some embodiments.

In some other embodiments, as shown in FIGS. 47 to 48, the oxide thin film transistor 1 is the top-gate thin film transistor, and the oxide thin film transistor 1 further includes a second silicon nitride layer 60 disposed between the oxide active layer 10 and both the source 30 and the drain 40.

In some examples, the second silicon nitride layer 60 is disposed between the oxide active layer 10 and the gate 20.

For example, in a case where the oxide thin film transistor 1 includes the second loose layer 112, as shown in FIG. 47, the second silicon nitride layer 60 is disposed on a surface of the second loose layer 112 facing the gate 20. In this case, as shown in FIG. 47, the second silicon nitride layer 60 and the second loose layer 112 together serve as the gate insulating layer.

For another example, in a case where the oxide thin film transistor 1 includes the second loose layer 112 and the second oxygen release layer 122 disposed on a surface of the second loose layer 112 facing away from the oxide active layer 10, as shown in FIG. 48, the second silicon nitride layer 60 is disposed on a surface of the second oxygen release layer 122 facing the gate 20. In this case, as shown in FIG. 48, the second silicon nitride layer 60, the second loose layer 112, and the second oxygen release layer 122 may together serve as the gate insulating layer.

In some other examples, the second silicon nitride layer 60 is disposed between the gate 20 and both the source 30 and the drain 40. In this case, the second silicon nitride layer 60 serves as the interlayer insulating layer 70. Of course, the second silicon nitride layer 60 and the interlayer insulating layer 70 may also be disposed in a stack in the thickness direction of the oxide active layer 10.

Optionally, a thickness of the second silicon nitride layer 60 is approximately in a range of 100 nm to 400 nm. For example, the thickness of the second silicon nitride layer 60 is 100 nm, 150 nm, 200 nm, 250 nm, 300 nm, 350 nm, or 400 nm.

The second silicon nitride layer 60 is mainly used to prevent water and oxygen or impurities from a side of the second silicon nitride layer 60 away from the oxide active layer 10 from affecting the oxide active layer 10.

Optionally, the first silicon nitride layer 50 and the second silicon nitride layer 60 are both included in the oxide thin film transistor 1. Functions of the first silicon nitride layer 50 and the second silicon nitride layer 60 are as described above and are not described herein again.

In a second possible implementation of the structure of the oxide thin film transistor 1, as shown in FIGS. 9 to 16 and 25 to 40, the gate 20 and the first loose layer 111 are disposed at a same side of the oxide active layer 10.

The oxide thin-film transistor 1 may be divided into two types, i.e., the bottom-gate thin film transistor and the top-gate thin film transistor.

The bottom-gate thin film transistor may have the following two structures.

In a first structure, as shown in FIGS. 9 to 16, the source 30 and the drain 40 are disposed on the second surface 102 of the oxide active layer 10 facing away from the gate 20, and the source 30 and the drain 40 are in direct contact with the oxide active layer 10. In this case, the oxide thin film transistor 1 is the BCE oxide thin film transistor. For example, the first loose layer 111 and the first oxygen release layer 121 together serve as the gate insulating layer.

In a second structure, as shown in FIGS. 25 to 32, the source 30 and the drain 40 are disposed at a side of the oxide active layer 10 away from the gate 20, and the source 30 and the drain 40 are each in contact with the oxide active layer 10 through at least one via hole 80 in a third insulating layer 104. In this case, the oxide thin film transistor 1 is the ES oxide thin film transistor. For example, the first loose layer 111 and the first oxygen release layer 121 together serve as the gate insulating layer.

Figure 28:
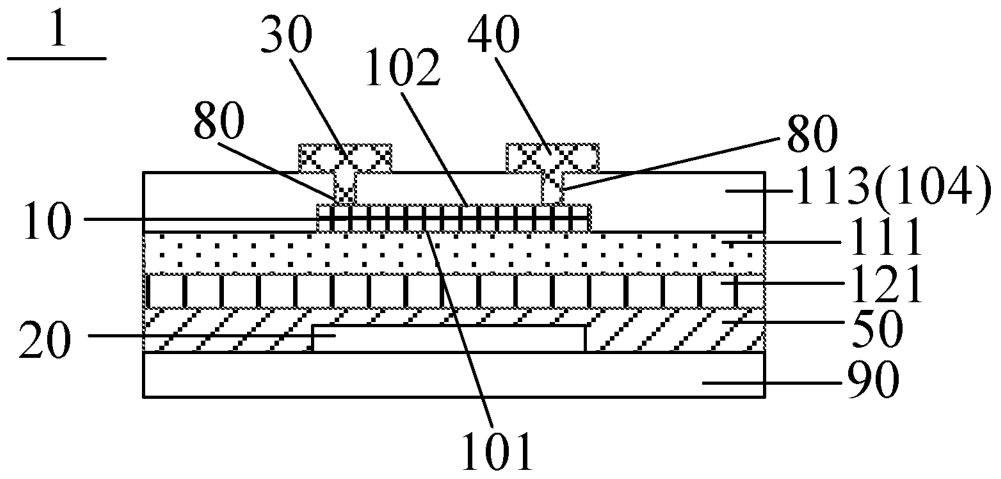
FIG. 28 is a diagram showing a structure of yet another etch stop oxide thin film transistor, in accordance with some embodiments.

In some examples, as shown in FIGS. 25 and 28, the oxide thin film transistor 1 further includes an etch stop layer 113 disposed between the oxide active layer 10 and both the source 30 and the drain 40, and the source 30 and the drain 40 are each in contact with the oxide active layer 10 through at least one via hole 80 extending through the etch stop layer 113. The etch stop layer 113 serves as the third insulating layer 104.

Figure 26:
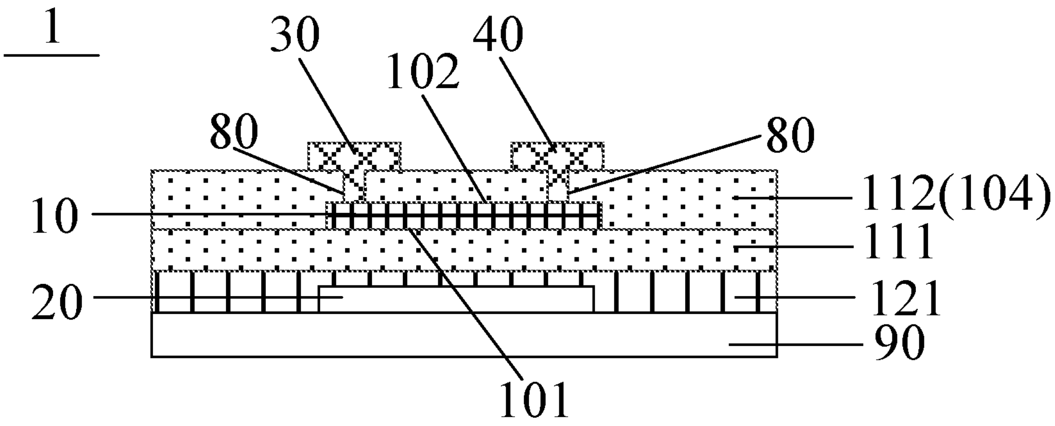
FIG. 26 is a diagram showing a structure of yet another etch stop oxide thin film transistor, in accordance with some embodiments.
Figure 29:
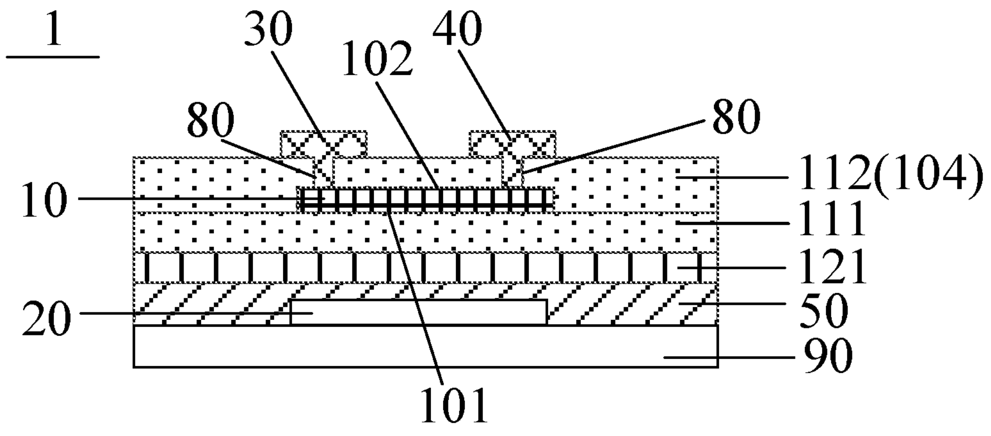
FIG. 29 is a diagram showing a structure of yet another etch stop oxide thin film transistor, in accordance with some embodiments.
Figure 31:
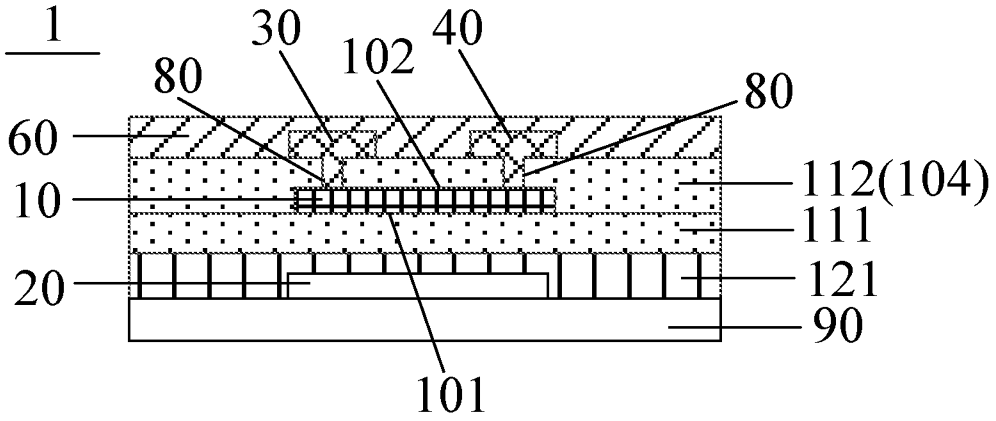
FIG. 31 is a diagram showing a structure of yet another etch stop oxide thin film transistor, in accordance with some embodiments.

In some other examples, as shown in FIGS. 26, 29 and 31, in a case where the oxide thin film transistor 1 includes the second loose layer 112, the second loose layer 112 serves as the third insulating layer 104. The source 30 and the drain 40 are each in contact with the oxide active layer 10 through at least one via hole 80 extending through the second loose layer 112.

Figure 27:
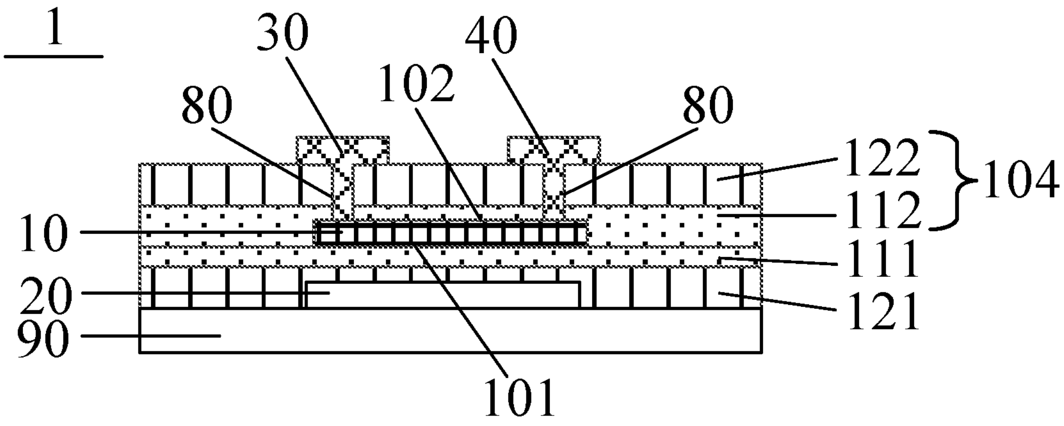
FIG. 27 is a diagram showing a structure of yet another etch stop oxide thin film transistor, in accordance with some embodiments.
Figure 30:
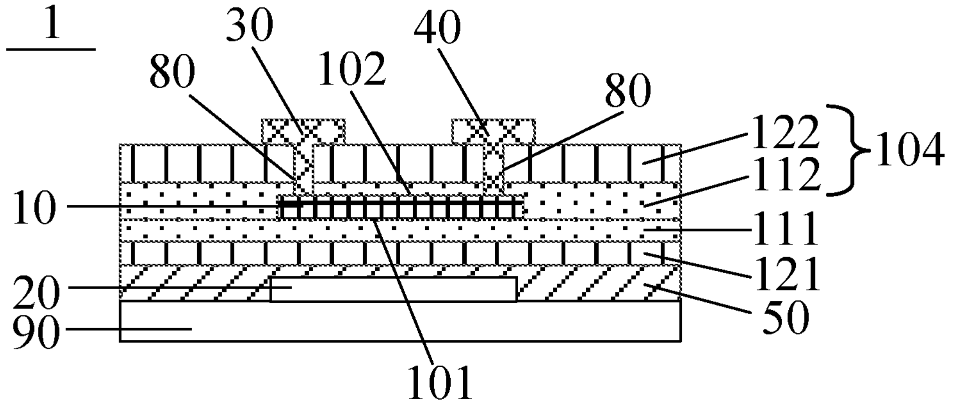
FIG. 30 is a diagram showing a structure of yet another etch stop oxide thin film transistor, in accordance with some embodiments.
Figure 32:
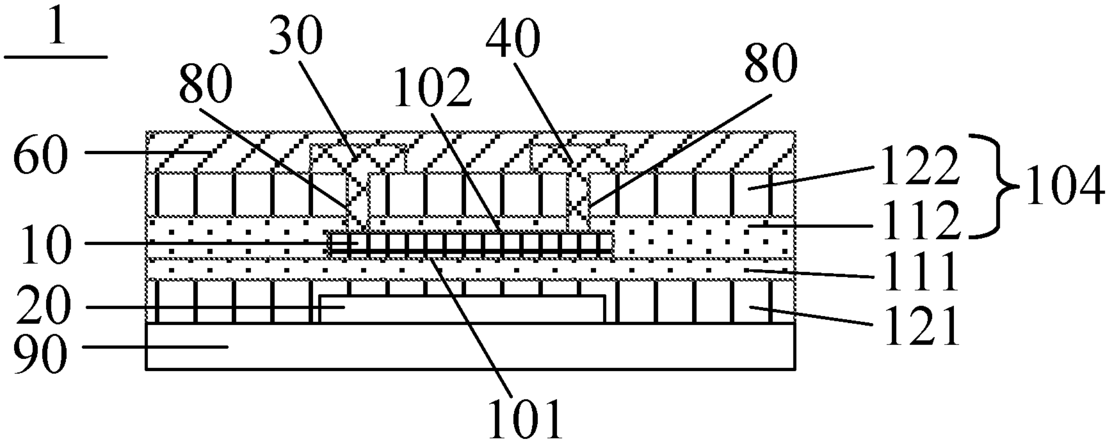
FIG. 32 is a diagram showing a structure of yet another etch stop oxide thin film transistor, in accordance with some embodiments.

In some other examples, as shown in FIGS. 27, 30 and 32, in a case where the oxide thin film transistor 1 includes the second loose layer 112 and the second oxygen release layer 122, the second loose layer 112 and the second oxygen release layer 122 together serves as the third insulating layer 104. The source 30 and the drain 40 are each in contact with the oxide active layer 10 through at least one via hole 80 extending through the second loose layer 112 and the second oxygen release layer 122.

As for the top-gate oxide thin film transistor, as shown in FIGS. 33 to 40, the gate 20 is disposed at a same side of the oxide active layer 10 as the source 30 and the drain 40, and the first loose layer 111 and the first oxygen release layer 121 are disposed between the gate 20 and the oxide active layer 10. In some embodiments, as shown in FIGS. 33 to 37, the first loose layer 111 and the first oxygen release layer 121 together serve as the gate insulating layer, and the oxide thin film transistor 1 further includes an interlayer insulating layer 70 disposed between the gate 20 and both the source 30 and the drain 40, for insulating the gate 20 and both the source 30 and the drain 40. In this case, the interlayer insulating layer 70, the first loose layer 111 and the first oxygen release layer 121 constitute a fourth insulating layer 105. That is, the source 30 and the drain 40 are each in contact with the oxide active layer 10 through at least one via hole 80 extending through the interlayer insulating layer 70, the first loose layer 111 and the first oxygen release layer 121.

In some embodiments, as shown in FIGS. 12 to 14 and 28 to 30, the oxide thin film transistor 1 is the bottom-gate thin film transistor, and the oxide thin film transistor 1 further includes a first silicon nitride layer 50 disposed between the gate 20 and the first oxygen release layer 121.

Figure 36:
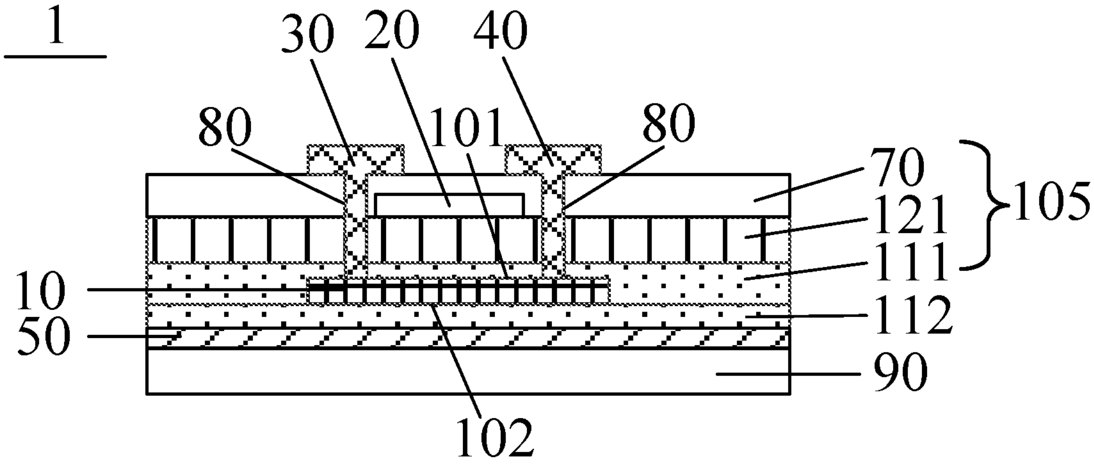
FIG. 36 is a diagram showing a structure of yet another top-gate oxide thin film transistor, in accordance with some embodiments.
Figure 37:
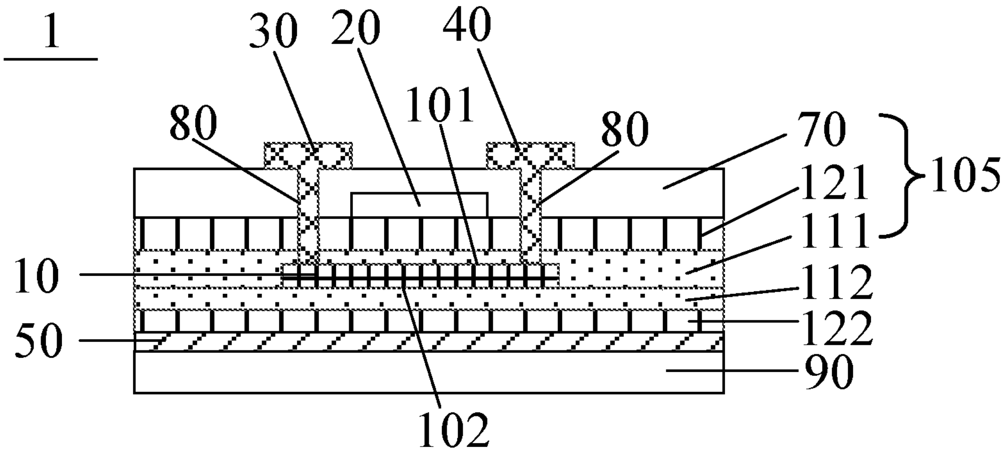
FIG. 37 is a diagram showing a structure of yet another top-gate oxide thin film transistor, in accordance with some embodiments.

In some embodiments, as shown in FIGS. 36 to 37, the oxide thin film transistor 1 is the top-gate thin film transistor, and the oxide thin film transistor 1 further includes a first silicon nitride layer 50 disposed at a side of the oxide active layer 10 away from the gate 20.

In a case where the oxide thin film transistor 1 includes the second loose layer 112, as shown in FIG. 36, the first silicon nitride layer 50 is disposed on a surface of the second loose layer 112 facing away from the oxide active layer 10.

In a case where the oxide thin film transistor 1 includes the second loose layer 112 and the second oxygen release layer 122 disposed on the surface of the second loose layer 112 facing away from the oxide active layer 10, as shown in FIG. 37, the first silicon nitride layer 50 is disposed on a surface of the second oxygen release layer 122 facing away from the oxide active layer 10.

With regard to the function of the first silicon nitride layer 50, reference may be made to the above related description, which is not described herein again.

In some embodiments, as shown in FIGS. 15, 16, 31 and 32, the oxide thin film transistor 1 is the bottom-gate thin film transistor, and the oxide thin film transistor 1 further includes a second silicon nitride layer 60 disposed at a side of the oxide active layer 10 away from the gate 20.

Figure 15:
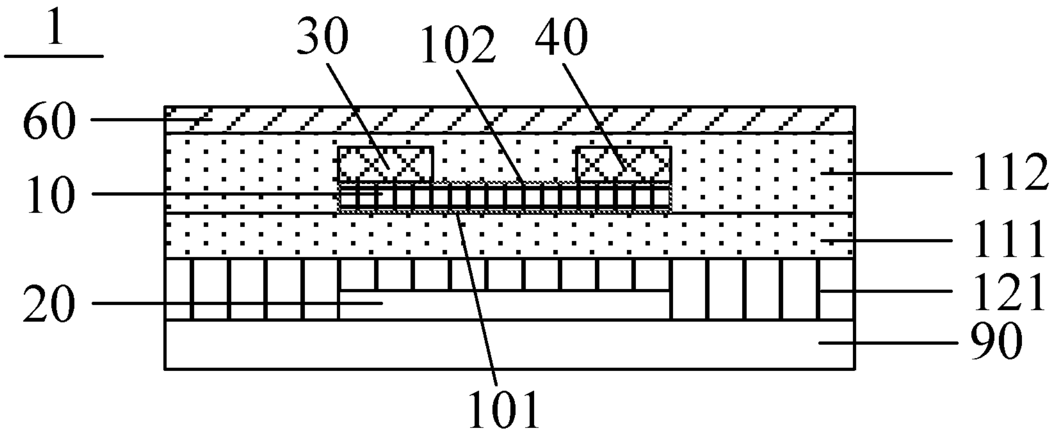
FIG. 15 is a diagram showing a structure of yet another back-channel-etch oxide thin film transistor, in accordance with some embodiments.

In a case where the oxide thin film transistor 1 includes the second loose layer 112, as shown in FIGS. 15 and 31, the second silicon nitride layer 60 is disposed on a surface of the second loose layer 112 facing away from the oxide active layer 10.

Figure 16:
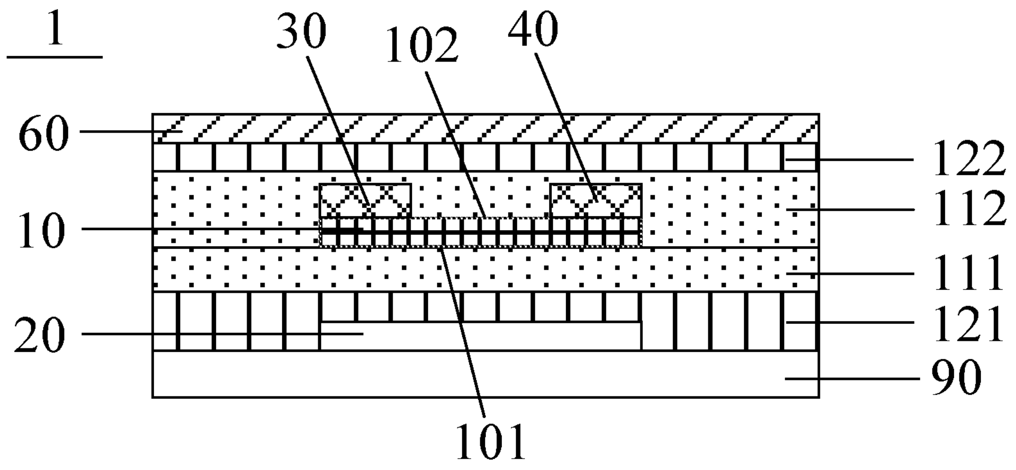
FIG. 16 is a diagram showing a structure of yet another back-channel-etch oxide thin film transistor, in accordance with some embodiments.

In a case where the oxide thin film transistor 1 includes the second loose layer 112 and the second oxygen release layer 122 disposed on the surface of the second loose layer 112 facing away from the oxide active layer 10, as shown in FIGS. 16 and 32, the second silicon nitride layer 60 is disposed on a surface of the second oxygen release layer 122 facing away from the oxide active layer 10.

Figure 38:
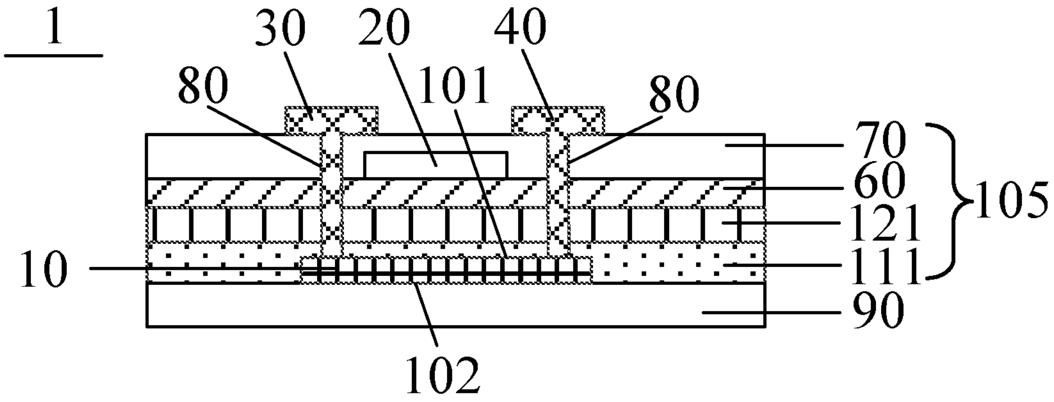
FIG. 38 is a diagram showing a structure of yet another top-gate oxide thin film transistor, in accordance with some embodiments.
Figure 39:
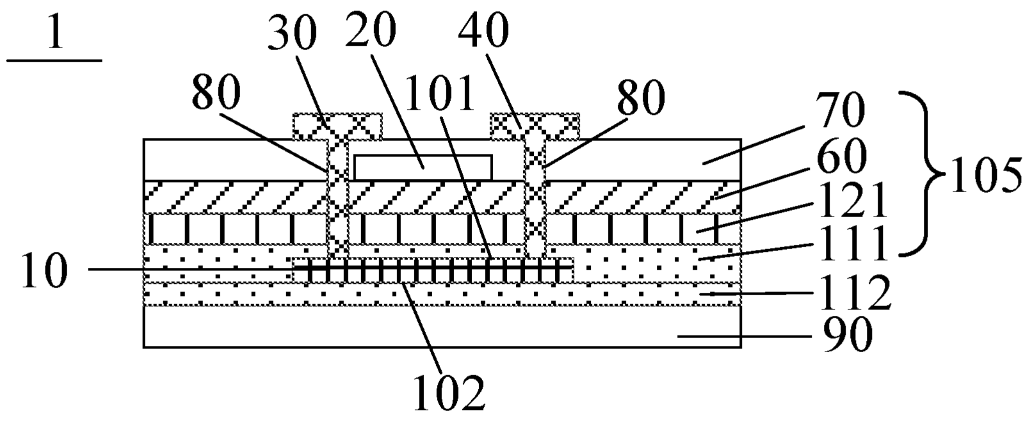
FIG. 39 is a diagram showing a structure of yet another top-gate oxide thin film transistor, in accordance with some embodiments.
Figure 40:
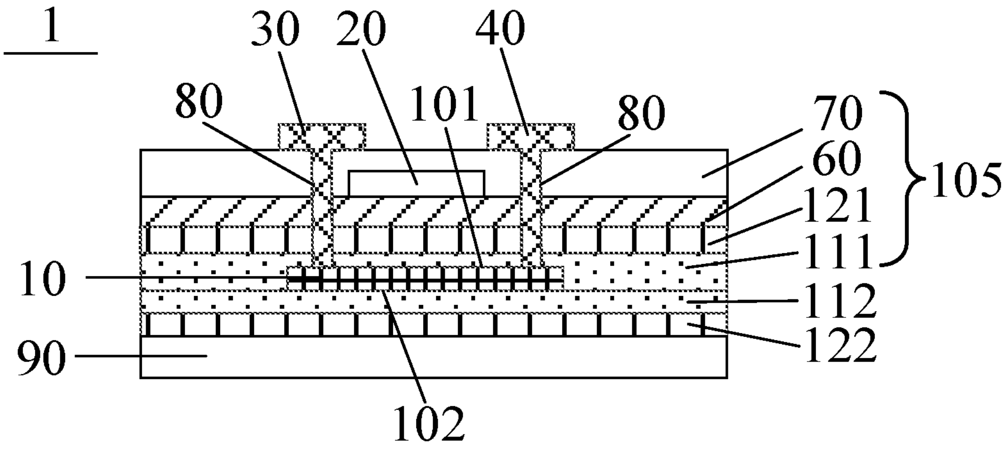
FIG. 40 is a diagram showing a structure of yet another top-gate oxide thin film transistor, in accordance with some embodiments.

In some other embodiments, as shown in FIGS. 38 to 40, the oxide thin-film transistor 1 is the top-gate thin film transistor, and the oxide thin-film transistor 1 further includes a second silicon nitride layer 60 disposed on a surface of the first oxygen release layer 121 facing away from the oxide active layer 10.

In this case, in some examples, the second silicon nitride layer 60 is disposed between the first oxygen release layer 121 and the gate 20. In this case, as shown in FIGS. 38 to 40, the first loose layer 111, the first oxygen release layer 121, the second silicon nitride layer 60 and the interlayer insulating layer 70 constitute the fourth insulating layer 105. The source 30 and the drain 40 are each in contact with the oxide active layer 10 through at least one via hole 80 extending through the first loose layer 111, the first oxygen release layer 121, the second silicon nitride layer 60 and the interlayer insulating layer 70. In some other examples, the second silicon nitride layer 60 is disposed between the gate 20 and both the source 30 and the drain 40. For example, the second silicon nitride layer 60 serves as the interlayer insulating layer 70. For another example, the second silicon nitride layer 60 and the interlayer insulating layer 70 are disposed in a stack in the thickness direction of the oxide active layer 10.

The function of the second silicon nitride layer 60 is the same as that described above and is not described herein again.

Optionally, the first silicon nitride layer 50 and the second silicon nitride layer 60 are both included in the oxide thin film transistor 1.

Some embodiments of the present disclosure provide an array substrate including the base 90 and a plurality of oxide thin film transistors 1 disposed above the base 90.

In this case, each layer of the first loose layer 111, the first oxygen release layer 121, the second loose layer 112, the second oxygen release layer 122, the first silicon nitride layer 50 and the second silicon nitride layer 60 is of an integrated structure in the array substrate. That is, the layer at least covers a display area of the array substrate. In addition, the gates 20 of all the oxide thin film transistors 1 may be disposed in a same layer, the oxide active layers 10 of all the oxide thin film transistors 1 may be disposed in a same layer, and the sources and the drains of all the oxide thin film transistors 1 may be disposed in a same layer. In this way, a manufacturing process may be simplified.

Figure 49:
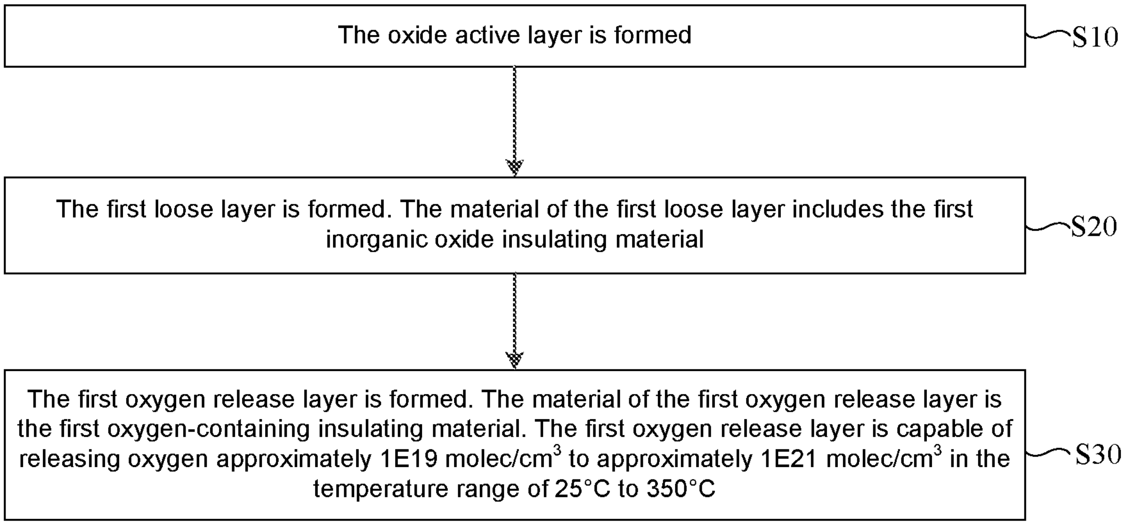
FIG. 49 is a flow diagram of a method of manufacturing an oxide thin film transistor, in accordance with some embodiments.

As shown in FIG. 49, some embodiments of the present disclosure provide a method of manufacturing an oxide thin film transistor, such as the oxide thin film transistor 1 described above. The method includes S10 to S30.

In S10, as shown in FIGS. 1, 9, 17, 25, 33 and 41, the oxide active layer 10 is formed.

In S20, as shown in FIGS. 1, 9, 17, 25, 33 and 41, the first loose layer 111 is formed. The material of the first loose layer 111 includes the first inorganic oxide insulating material.

In S30, as shown in FIGS. 1, 9, 17, 25, 33 and 41, the first oxygen release layer 121 is formed. The material of the first oxygen release layer 121 is the first oxygen-containing insulating material. The first oxygen release layer 121 is capable of releasing oxygen approximately 1E19 molec/$cm^3$ to approximately 1E21 molec/$cm^3$ in the temperature range of 25° C. to 350° C.

In some embodiments, as shown in FIGS. 1, 17 and 33, a sequence of performing S10, S20 and S30 is: first performing S10, then performing S20, and then performing S30. In this case, the oxide active layer 10, the first loose layer 111 and the first oxygen release layer 121 are sequentially formed on the base 90 in a thickness direction of the base 90.

In some other embodiments, as shown in FIGS. 9, 25 and 41, the sequence of performing S10, S20 and S30 is: first performing S30, then performing S20, and then performing S10. In this case, the first oxygen release layer 121, the first loose layer 111, and the oxide active layer 10 are sequentially formed on the base 90 in the thickness direction of the base 90.

Optionally, the material of the first loose layer 111 can include or can be $SiO_2$. The first loose layer 111 is formed by using, for example, a plasma chemical vapor deposition method.

The step of forming the first loose layer 111 includes: forming the first loose layer 111 under a condition that a gas flow ratio of $N_2O$ to $SiH_4$ is approximately in a range of 90:1 to 170:1, an air pressure is approximately in a range of 500 mTorr to 900 mTorr, and a power is approximately in a range of 1000 W to 7000 W.

By setting the above deposition condition, the first loose layer 111 has pore structures. In addition, the refractive index of the first loose layer 111 formed under the above condition is approximately in the range of 1.445 to 1.455, a defect state of the first loose layer 111 is below 2E18 spins/$cm^3$, and an amount of water absorbed by the first loose layer 111 is below 2E20/$cm^3$ (that is the first loose layer 111 has a property of not easily absorbing water), which improve the performances of the oxide thin film transistor 1.

By performing infrared spectroscopy analysis on the first loose layer 111, the infrared wavenumber corresponding to a Si—O bond absorption peak is approximately in a range of 1050 $cm^{-1}$ to 1060 $cm^{-1}$.

Optionally, the material of the first oxygen release layer 121 can include or can be $SiO_2$. The first oxygen release layer 121 is formed by using, for example, the plasma chemical vapor deposition method.

The step of forming the first oxygen release layer 121 includes: forming the first oxygen release layer 121 under a condition that the gas flow ratio of $N_2O$ to $SiH_4$ is approximately in a range of 40:1 to 170:1, the air pressure is approximately in a range of 1000 mTorr to 2100 mTorr, and the power is approximately in a range of 9000 W to 21000 W.

By setting the above deposition condition, the first oxygen release layer 121 is capable of releasing oxygen of approximately 1E19 molec/$cm^3$ to approximately 1E21 molec/$cm^3$.

By performing an infrared spectroscopy analysis on the first oxygen release layer 121, the infrared wavenumber corresponding to a Si—O bond absorption peak is approximately in a range of 1060 $cm^{-1}$ to 1072 $cm^{-1}$.

Figure 10:
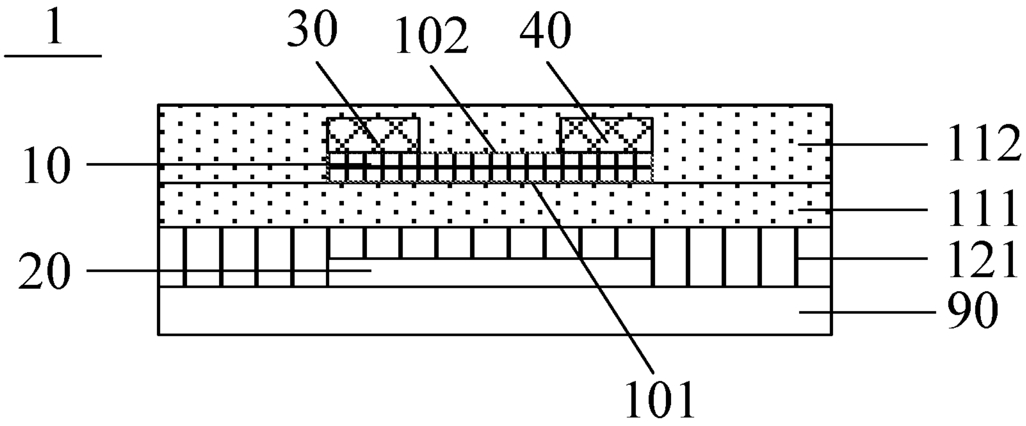
FIG. 10 is a diagram showing a structure of yet another back-channel-etch oxide thin film transistor, in accordance with some embodiments.
Figure 50:
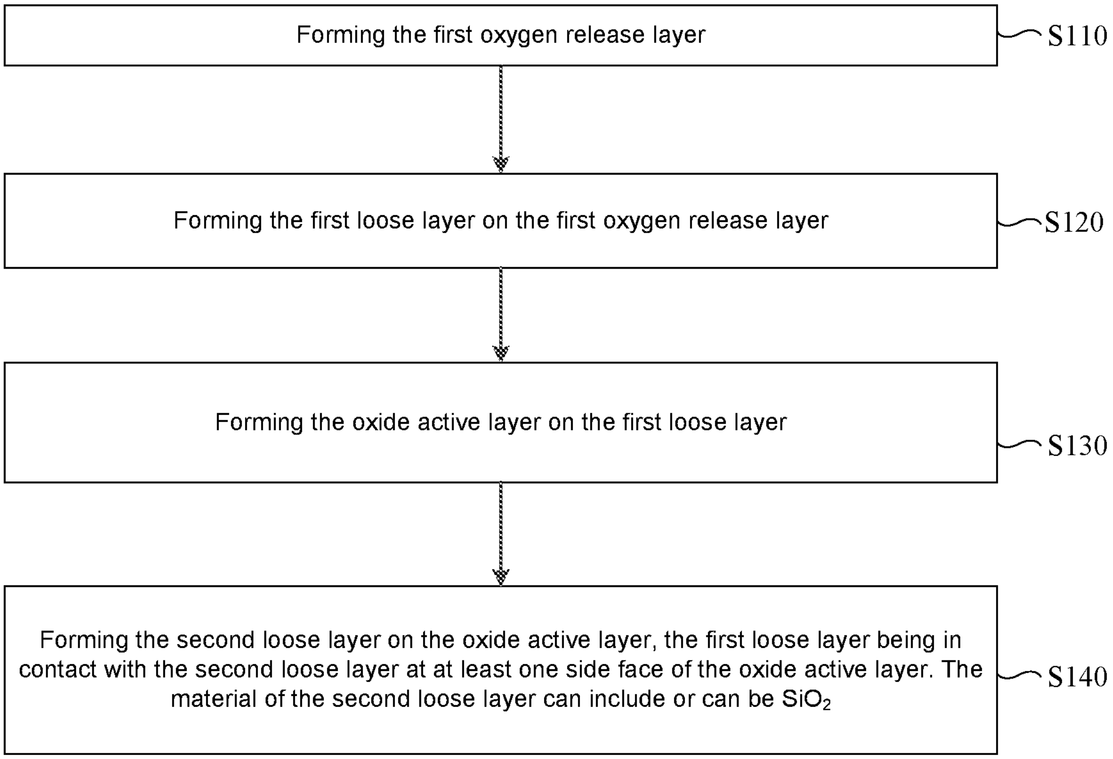
FIG. 50 is a flow diagram of another method of manufacturing an oxide thin film transistor, in accordance with some embodiments.

In some embodiments, as shown in FIG. 50, the steps of forming the oxide active layer 10, the first loose layer 111 and the first oxygen release layer 121 include: as shown in FIGS. 10, 26 and 42, forming (S110) the first oxygen release layer 121; as shown in FIGS. 10, 26 and 42, forming (S120) the first loose layer 111 on the first oxygen release layer 121; and as shown in FIGS. 10, 26 and 42, forming (S130) the oxide active layer 10 on the first loose layer 111.

On this basis, as shown in FIG. 50, the method may further include: as shown in FIGS. 10, 26 and 42, forming (S140) the second loose layer 112 on the oxide active layer 10, the first loose layer 111 being in contact with the second loose layer 112 at at least one side face of the oxide active layer 10. The material of the second loose layer 112 can include or can be $SiO_2$.

The second loose layer 112 is deposited by using, for example, the plasma chemical vapor deposition method.

For example, the step of forming the second loose layer 112 includes: forming the second loose layer 112 under a condition that the gas flow ratio of $N_2O$ to $SiH_4$ is approximately in the range of 90:1 to 170:1, a gas flow ratio of $N_2O$ to $NH_3$ is approximately in a range of 10:1 to 100:1, the air pressure is approximately in the range of 500 mTorr to 900 mTorr, and the power is approximately in the range of 1000 W to 7000 W.

By adding $NH_3$ into the above deposition condition, the second loose layer 112 has pore structures, the second loose layer 112 may be made looser than the first loose layer 111.

Figure 11:
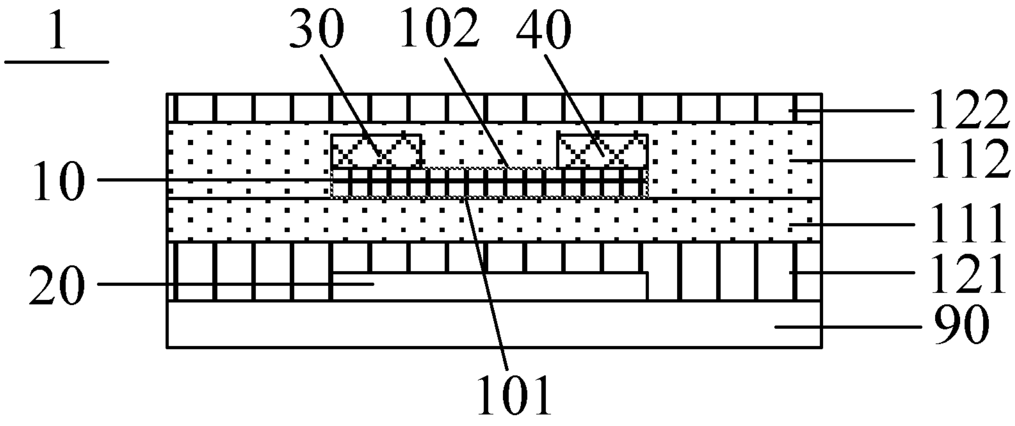
FIG. 11 is a diagram showing a structure of yet another back-channel-etch oxide thin film transistor, in accordance with some embodiments.
Figure 12:
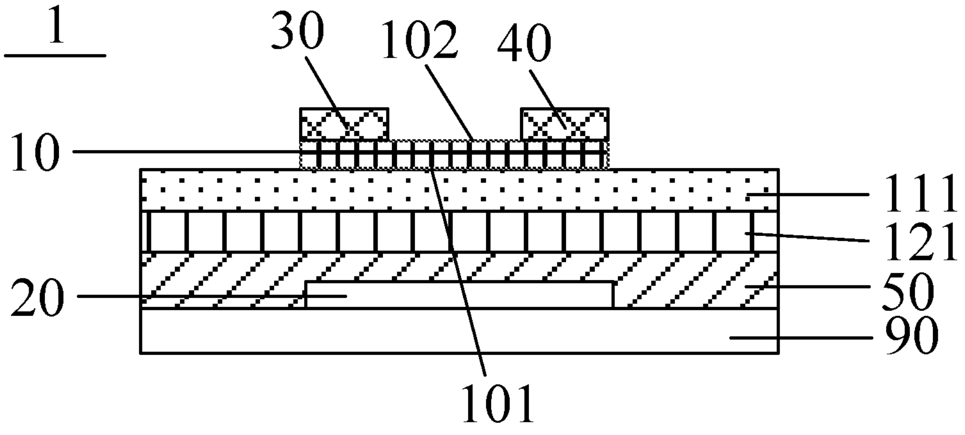
FIG. 12 is a diagram showing a structure of yet another back-channel-etch oxide thin film transistor, in accordance with some embodiments.
Figure 13:
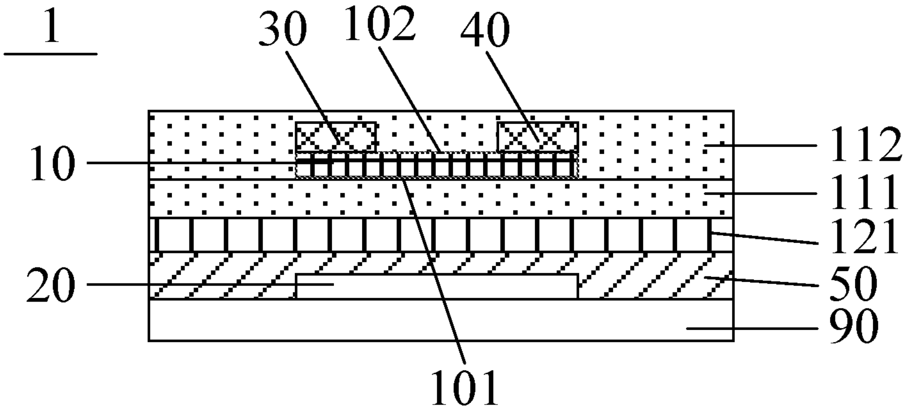
FIG. 13 is a diagram showing a structure of yet another back-channel-etch oxide thin film transistor, in accordance with some embodiments.
Figure 14:
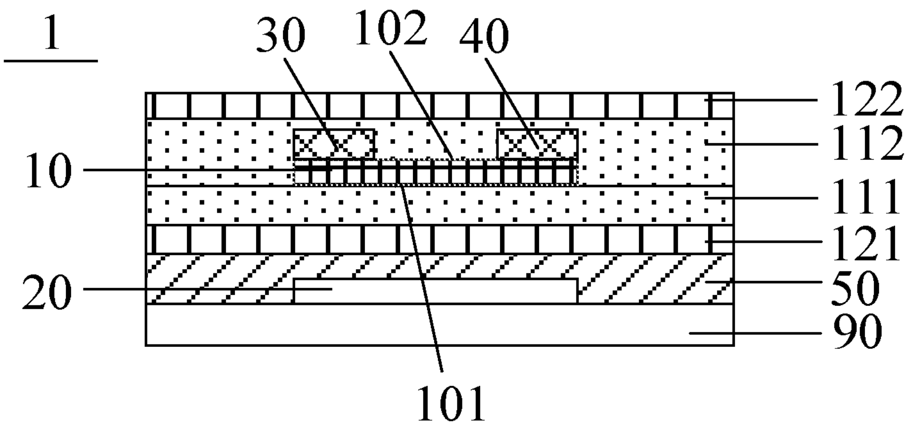
FIG. 14 is a diagram showing a structure of yet another back-channel-etch oxide thin film transistor, in accordance with some embodiments.
Figure 51:
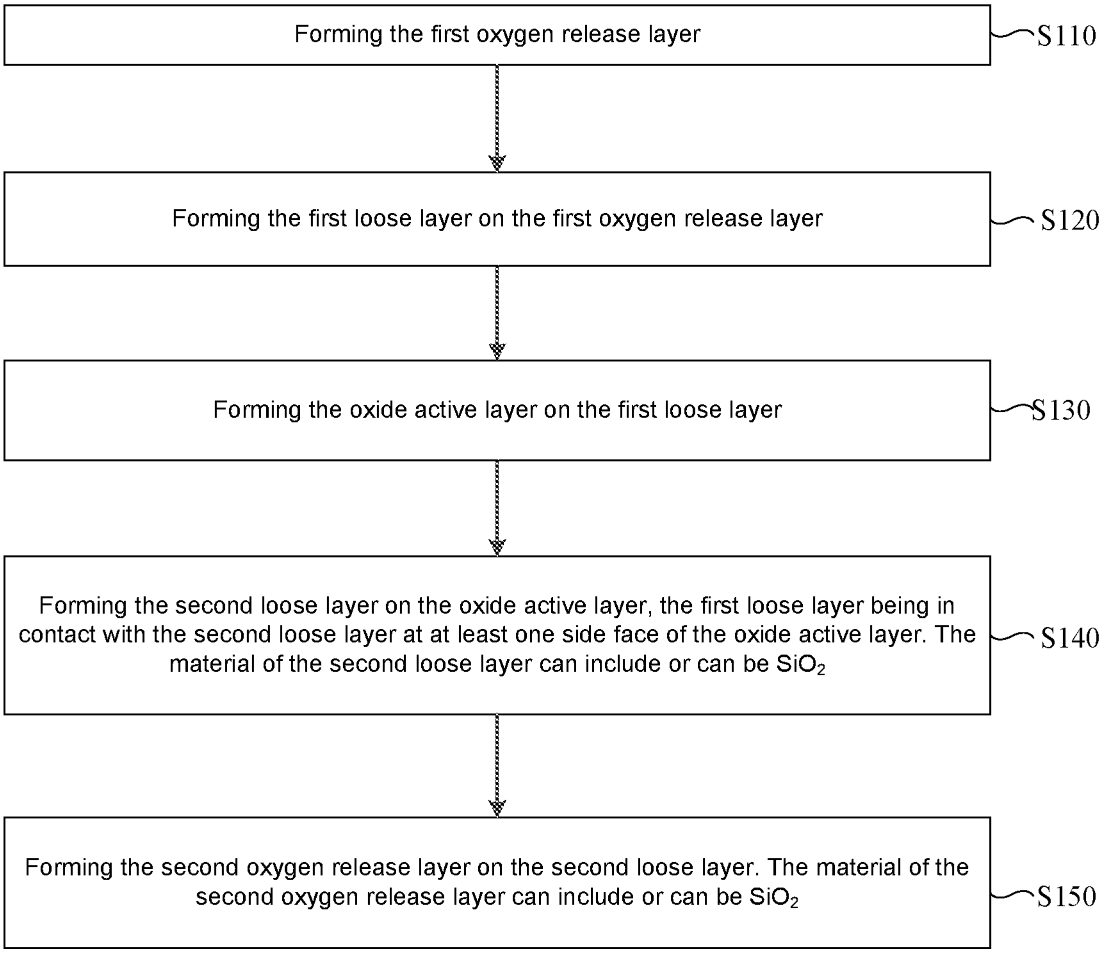
FIG. 51 is a flow diagram of yet another method of manufacturing an oxide thin film transistor, in accordance with some embodiments.

In addition, as shown in FIG. 51, the method may further include: as shown in FIGS. 11, 27 and 43, forming (S150) the second oxygen release layer 122 on the second loose layer 122. The material of the second oxygen release layer 122 can include or can be $SiO_2$.

The second oxygen release layer 122 is deposited by using, for example, the plasma chemical vapor deposition method.

The step of forming the second oxygen release layer 122, for example, includes: forming the second oxygen release layer 122 under the condition that the gas flow ratio of $N_2O$ to $SiH_4$ is approximately in the range of 40:1 to 170:1, the air pressure is approximately in the range of 1000 mTorr to 2100 mTorr, and the power is approximately in the range of 9000 W to 21000 W.

Figure 18:
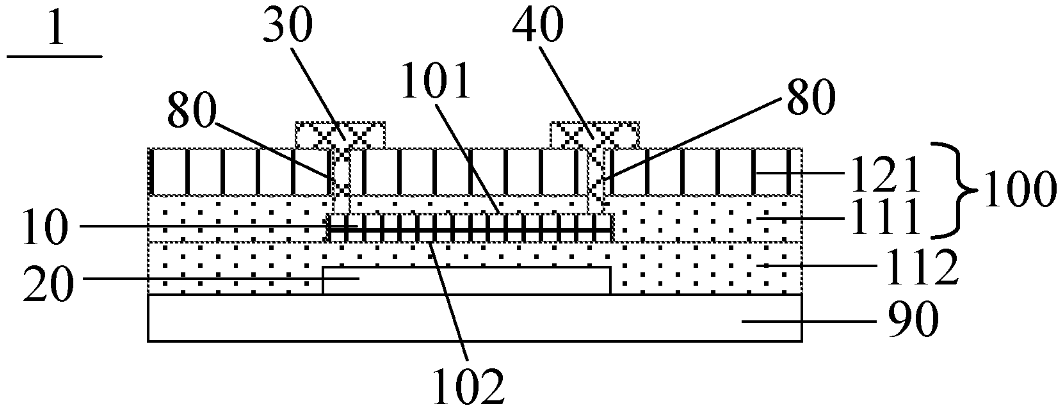
FIG. 18 is a diagram showing a structure of another etch stop oxide thin film transistor, in accordance with some embodiments.
Figure 34:
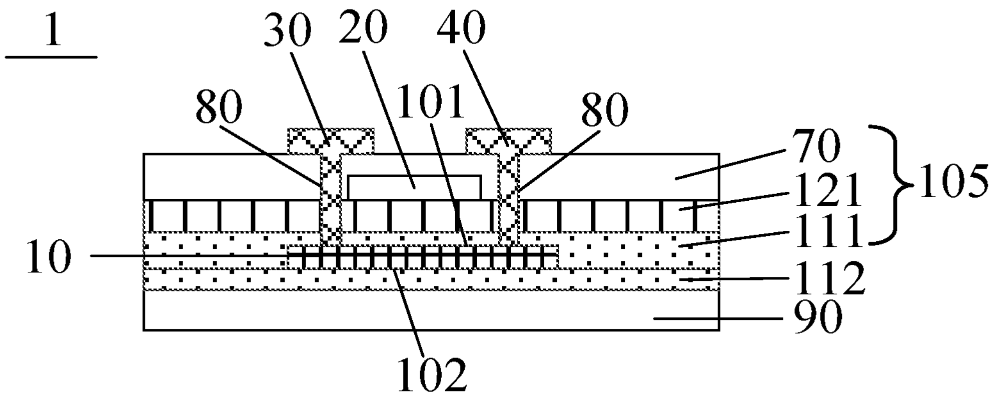
FIG. 34 is a diagram showing a structure of another top-gate oxide thin film transistor, in accordance with some embodiments.
Figure 52:
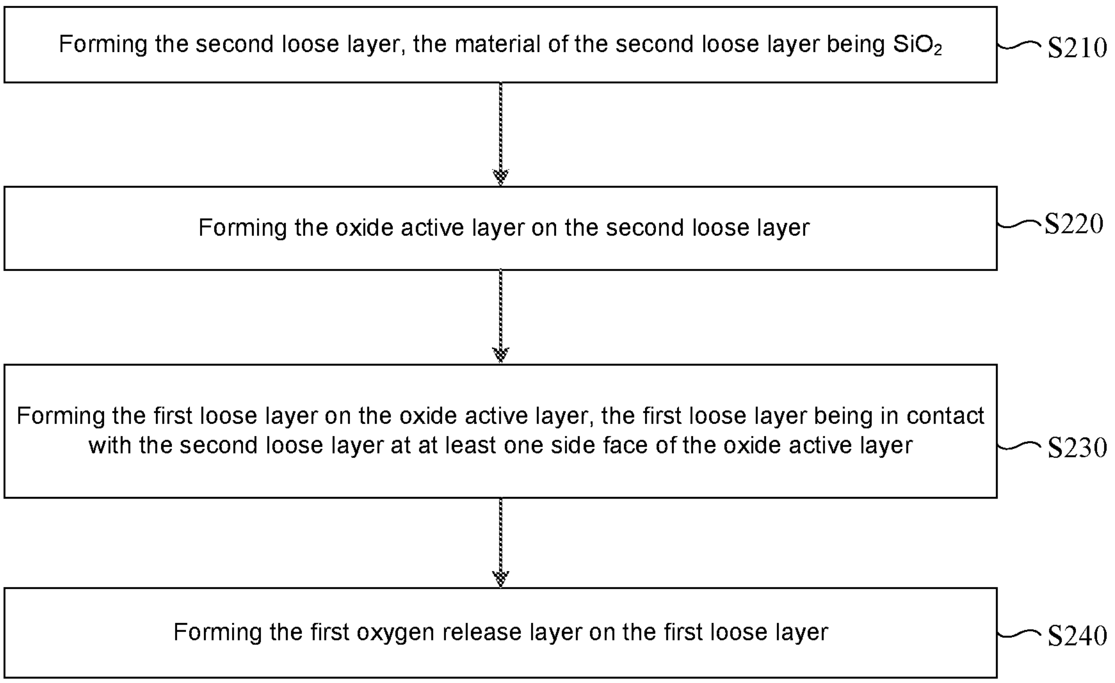
FIG. 52 is a flow diagram of yet another method of manufacturing an oxide thin film transistor, in accordance with some embodiments.

In some other embodiments, as shown in FIG. 52, the method of manufacturing the oxide thin film transistor 1 includes: as shown in FIGS. 2, 18 and 34, forming (S210) the second loose layer 112, the material of the second loose layer 112 being $SiO_2$; as shown in FIGS. 2, 18 and 34, forming the oxide active layer 10 on the second loose layer 112 (S220); as shown in FIGS. 2, 18 and 34, forming (S230) the first loose layer 111 on the oxide active layer 10, the first loose layer 111 being in contact with the second loose layer 112 at at least one side face of the oxide active layer 10; and as shown in FIGS. 2, 18 and 34, forming the first oxygen release layer 121 on the first loose layer 111 (S240).

The second loose layer 112 is deposited by using, for example, the plasma chemical vapor deposition method.

The step of forming the second loose layer 112, for example, includes: forming the second loose layer 112 under the condition that the gas flow ratio of $N_2O$ to $SiH_4$ is approximately in the range of 90:1 to 170:1, the gas flow ratio of $N_2O$ to $NH_3$ is approximately in the range of 10:1 to 100:1, the air pressure is approximately in the range of 500 mTorr to 900 mTorr, and the power is approximately in the range of 1000 W to 7000 W.

Figure 3:
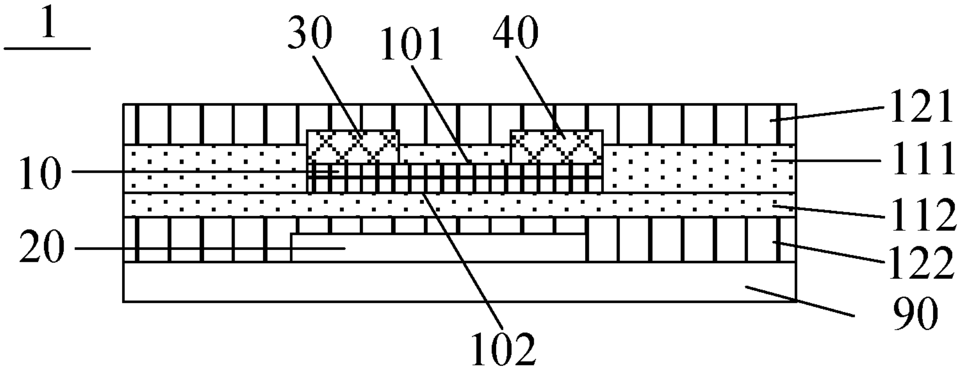
FIG. 3 is a diagram showing a structure of yet another back-channel-etch oxide thin film transistor, in accordance with some embodiments.
Figure 19:
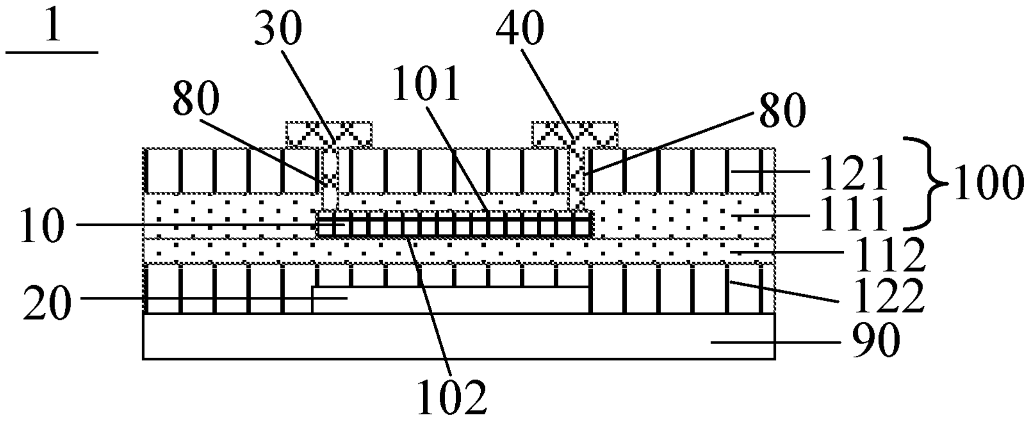
FIG. 19 is a diagram showing a structure of yet another etch stop oxide thin film transistor, in accordance with some embodiments.
Figure 35:
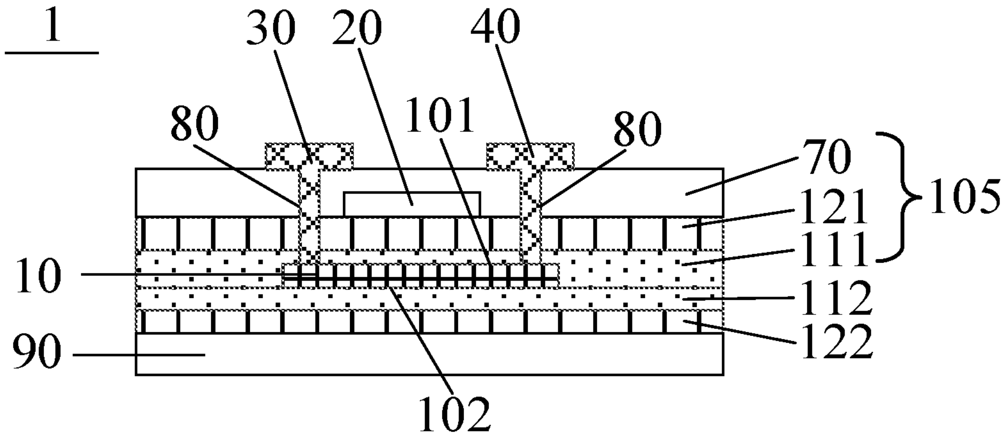
FIG. 35 is a diagram showing a structure of yet another top-gate oxide thin film transistor, in accordance with some embodiments.
Figure 53:
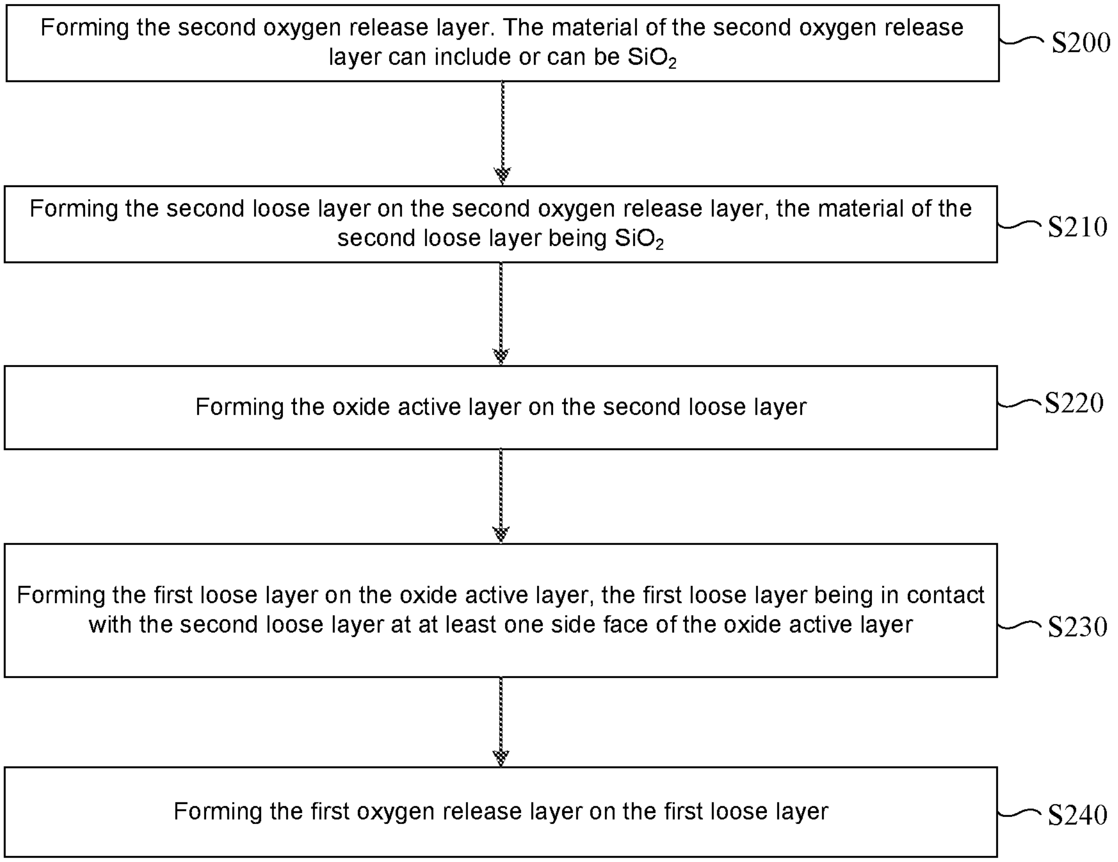
FIG. 53 is a flow diagram of yet another method of manufacturing an oxide thin film transistor, in accordance with some embodiments.

On this basis, as shown in FIG. 53, before forming the second loose layer 112, the method may further include: as shown in FIGS. 3, 19 and 35, forming (S200) the second oxygen release layer 122. The material of the second oxygen release layer 122 can include or can be $SiO_2$.

In this case, forming the second loose layer 112, for example, includes: forming the second loose layer 112 on the second oxygen release layer 122.

The second oxygen release layer 122 is deposited by using, for example, the plasma chemical vapor deposition method.

The step of forming the second oxygen release layer 122, for example, includes: forming the second oxygen release layer 122 under the condition that the gas flow ratio of $N_2O$ to $SiH_4$ is approximately in the range of 40:1 to 170:1, the air pressure is approximately in the range of 1000 mTorr to 2100 mTorr, and the power is approximately in the range of 9000 W to 21000 W.

On the above basis, the manufacturing method further includes forming the gate 20 and forming the source 30 and the drain 40. As for positions where the gate 20, the source 30 and the drain 40 are formed, reference may be made to various structures of the oxide thin film transistor, and they are not described herein again.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A thin film transistor, comprising:

an active layer;

a first loose layer that is at least disposed on a first surface of the active layer perpendicular to a thickness direction of the active layer, and is in contact with the active layer, wherein a material of the first loose layer includes a first inorganic oxide insulating material; and a first oxygen release layer that is disposed on a surface of the first loose layer facing away from the active layer, and is in contact with the first loose layer, wherein a material of the first oxygen release layer is a first oxygen-containing insulating material, wherein a porosity of the first loose layer is different from a porosity of the first oxygen release layer, and/or an oxygen content of the first loose layer is different from an oxygen content of the first oxygen release layer;

the first loose layer is capable of releasing oxygen of approximately 1E18 molec/$cm^3$ to approximately 8E18 molec/$cm^3$ in a temperature range of 25° C. to 350° C.; and the first oxygen release layer is capable of releasing oxygen of approximately 1E19 molec/$cm^3$ to approximately 1E21 molec/$cm^3$ in the temperature range of 25° C. to 350° C.

2. The thin film transistor according to claim 1, wherein the porosity of the first loose layer is less than the porosity of the first oxygen release layer.

3. The thin film transistor according to claim 2, wherein the porosity of the first loose layer is capable of being represented by:

after being immersed in an etching solution, the first loose layer having pores with a size range of 30 nm to 150 nm; and the porosity of the first oxygen release layer is capable of being represented by:

after being immersed in the etching solution, the first oxygen release layer having pores with a size range of 50 nm to 200 nm;

wherein the etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %.

4. The thin film transistor according to claim 1, wherein a density of the first loose layer is greater than a density of the first oxygen release layer.

5. The thin film transistor according to claim 4, wherein the density of the first loose layer is capable of being represented by:

an etching rate of the first loose layer in an etching solution is in a range of 30 Å/s to 100 Å/s; and the density of the first oxygen release layer is capable of being represented by:

an etching rate of the first oxygen release layer in the etching solution is in a range of 50 Å/s to 200 Å/s;

wherein the etching solution is a mixed solution of an aqueous solution of $NH_3F$ and an aqueous solution of HF in which a concentration of $NH_3F$ is in a range of 29.8 wt % to 30.2 wt %, and a concentration of HF is in a range of 5.9 wt % to 6.1 wt %.

6. The thin film transistor according to claim 1, wherein a material of the first loose layer includes a silicon (Si) element and an oxygen (O)) element, and a refractive index thereof is in a range of approximately 1.445 to approximately 1.455; and a material of the first oxygen release layer includes the silicon (Si) element and the oxygen (O) element, and a refractive index thereof is in a range of approximately 1.440 to approximately 1.470.

7. The thin film transistor according to claim 1, wherein a material of the first loose layer includes a silicon (Si) element and an oxygen (O)) element, and the first loose layer has an infrared spectrum in which an infrared wavenumber corresponding to a Si—O bond absorption peak is in a range of approximately 1050 $cm^{-1}$ to approximately 1060 $cm^{-1}$; and a material of the first oxygen release layer includes the silicon (Si) element and the oxygen (O) element, and the first oxygen release layer has an infrared spectrum in which an infrared wavenumber corresponding to a Si—O bond absorption peak is in a range of approximately 1060 $cm^{-1}$ to approximately 1072 $cm^{-1}$.

8. The thin film transistor according to claim 1, further comprising:

a second loose layer that is at least disposed on a second surface of the active layer opposite to the first surface and is in contact with the active layer, wherein a material of the second loose layer includes a second inorganic oxide insulating material, and the first loose layer is in contact with the second loose layer at at least one side face of the active layer.

9. The thin film transistor according to claim 8, further comprising:

a second oxygen release layer that is disposed on a surface of the second loose layer facing away from the active layer and is in contact with the second loose layer, wherein a material of the second oxygen release layer is a second oxygen-containing insulating material, and the second oxygen release layer is capable of releasing oxygen of approximately 1E19 molec/$cm^3$ to approximately 1E21 molec/$cm^3$ in a temperature range of 25° C. to 350° C.

10. The thin film transistor according to claim 9, wherein the material of the first loose layer is the same as the material of the second loose layer, and the first oxygen-containing insulating material is the same as the second oxygen-containing insulating material.

11. The thin film transistor according to claim 9, wherein the material of the first loose layer, the material of the second loose layer, the material of the first oxygen release layer, and the material of the second oxygen release layer each include an oxygen (O) element, and at least one of a silicon (Si) element or an aluminum (Al) element.

12. The thin film transistor according to claim 8, wherein the material of the first loose layer and the material of the second loose layer are both include a silicon (Si) element and an oxygen (O) element, and a refractive index of the first loose layer and a refractive index of the second loose layer are in a range of approximately 1.445 to approximately 1.455.

13. The thin film transistor according to claim 1, wherein a material of the active layer includes an oxide semiconductor material.

14. The thin film transistor according to claim 1, further comprising:

a gate disposed at a side of the active layer away from the first loose layer;

a source and a drain, wherein the source and the drain are disposed on the first surface of the active layer and are in direct contact with the active layer; and at least one of a first silicon nitride layer or a second silicon nitride layer, wherein the first silicon nitride layer is disposed at a side of the active layer proximate to the gate, and the second silicon nitride layer is disposed on a surface of the first oxygen release layer facing away from the gate.

15. The thin film transistor according to claim 1, further comprising:

a gate disposed at a side of the active layer away from the first loose layer;

a source and a drain, wherein the source and the drain are disposed at a side of the active layer away from the gate, and the source and the drain are each in contact with the active layer through at least one via hole formed in a first insulating layer including both the first loose layer and the first oxygen release layer; and at least one of a first silicon nitride layer or a second silicon nitride layer, wherein the first silicon nitride layer is disposed at a side of the active layer proximate to the gate, and the second silicon nitride layer is disposed on a surface of the first oxygen release layer facing away from the gate.

16. The thin film transistor according to claim 1, further comprising:

a gate disposed at a side of the active layer away from the first loose layer;

a source and a drain, wherein the gate is disposed at a same side of the active layer as the source and the drain, the thin film transistor further comprises a second insulating layer, the second insulating layer includes an interlayer insulating layer between the gate and both the source and the drain, and a gate insulating layer between the gate and the active layer, and the source and the drain are each in contact with the active layer through at least one via hole formed in the second insulating layer; and at least one of a first silicon nitride layer or a second silicon nitride layer, wherein the first silicon nitride layer is disposed on a surface of the first oxygen release layer facing away from the gate, and the second silicon nitride layer is disposed between the active layer and both the source and the drain.

17. The thin film transistor according to claim 1, further comprising:

a gate disposed at a same side of the active layer as the first loose layer;

a source and a drain, wherein the source and the drain are disposed on a second surface of the active layer opposite to the first surface, and are in direct contact with the active layer; and at least one of a first silicon nitride layer or a second silicon nitride layer, wherein the first silicon nitride layer is disposed between the gate and the first oxygen release layer, and the second silicon nitride layer is disposed at a side of the active layer away from the gate.

18. The thin film transistor according to claim 1, further comprising:

a gate disposed at a same side of the active layer as the first loose layer;

a source and a drain, wherein the source and the drain are disposed at a side of the active layer away from the gate; and the thin film transistor further comprises a third insulating layer between the active layer and both the source and the drain, and the source and the drain are each in contact with the active layer through at least one via hole formed in the third insulating layer; and at least one of a first silicon nitride layer or a second silicon nitride layer, wherein the first silicon nitride layer is disposed between the gate and the first oxygen release layer, and the second silicon nitride layer is disposed at a side of the active layer away from the gate.

19. An array substrate, comprising:

a base; and a plurality of thin film transistors each according to claim 1 disposed above the base.

20. A thin film transistor, comprising:

an active layer;

a first loose layer that is at least disposed on a first surface of the active layer perpendicular to a thickness direction of the active layer, and is in contact with the active layer, wherein a material of the first loose layer includes a first inorganic oxide insulating material; and a first oxygen release layer that is disposed on a surface of the first loose layer facing away from the active layer, and is in contact with the first loose layer, wherein a material of the first oxygen release layer is a first oxygen-containing insulating material, wherein a porosity of the first loose layer is different from a porosity of the first oxygen release layer, and/or an oxygen content of the first loose layer is different from an oxygen content of the first oxygen release layer;

a material of the first loose layer includes a silicon (Si) element and an oxygen (O) element, and a refractive index thereof is in a range of approximately 1.445 to approximately 1.455; and a material of the first oxygen release layer includes the silicon (Si) element and the oxygen (O) element, and a refractive index thereof is in a range of approximately 1.440 to approximately 1.470.

* * * * *